(12) United States Patent
Yamamoto

(10) Patent No.: US 10,275,309 B2
(45) Date of Patent: Apr. 30, 2019

(54) MULTI-LAYER INTEGRATED ZONE PARTITION SYSTEM ERROR CORRECTION

(71) Applicant: Western Digital Technologies, Inc., San Jose, CA (US)

(72) Inventor: Satoshi Yamamoto, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 30 days.

(21) Appl. No.: 15/497,879

(22) Filed: Apr. 26, 2017

(65) Prior Publication Data
US 2018/0314594 A1 Nov. 1, 2018

(51) Int. Cl.
G06F 11/10 (2006.01)
H03M 13/00 (2006.01)
H03M 13/11 (2006.01)
G06F 11/14 (2006.01)

(52) U.S. Cl.
CPC ...... G06F 11/1076 (2013.01); G06F 11/1435 (2013.01); H03M 13/1148 (2013.01); H03M 13/616 (2013.01)

(58) Field of Classification Search
CPC ............. G06F 11/1068; G06F 11/1072; G06F 11/1076; G06F 11/08; G06F 3/0619; H03M 13/1435; H03M 13/1148; H03M 13/616; H03M 13/03; H03M 13/09
See application file for complete search history.

(56) References Cited

U.S. PATENT DOCUMENTS

| | | |
|---|---|---|
| 5,946,328 A | 8/1999 | Cox et al. |
| 6,061,824 A | 5/2000 | Mo et al. |
| 6,275,965 B1 | 8/2001 | Cox et al. |
| 6,651,213 B2 | 11/2003 | Hassner et al. |
| 6,891,690 B2 | 5/2005 | Asano et al. |

(Continued)

OTHER PUBLICATIONS

James S. Plank, Optimizing Cauchy Reed-Solomon Codes for Fault-Tolerant Storage Applications, Dec. 2005, pp. 1-11, Technical Report CS-05-569 Department of Computer Science University of Tennessee, Knoxville TN USA.

(Continued)

*Primary Examiner* — Shelly A Chase
(74) *Attorney, Agent, or Firm* — John D. Henkhaus

(57) ABSTRACT

A multi-layer error correction coding (ECC) parity technique involves dividing a data band into sub-data bands, generating a respective $1^{st}$-layer sub-data band parity matrix for each associated sub-data band, and generating a respective ($q^{th}>1$)-layer parity matrix for sets of associated adjacent sub-data bands. In the context of a data storage system, the parity generation may be performed at the system-side, and communicated and written to one or more associated data storage devices (DSDs) along with the corresponding data, whereby the DSDs may further associate track ECC information to the written data. In response to receiving at the system-side, location-identifying information about data errors that are not correctable by the DSD using track ECC information, the system may determine an amount of the multi-layer parity information needed to recover the corrupt data, and make a data/parity read request accordingly.

18 Claims, 17 Drawing Sheets

(56) References Cited

U.S. PATENT DOCUMENTS

| | | |
|---|---|---|
| 6,903,887 B2 | 6/2005 | Asano et al. |
| 6,928,515 B2 | 8/2005 | Hassner et al. |
| 7,389,466 B1 | 6/2008 | Harmer et al. |
| 7,490,263 B2 | 2/2009 | King |
| 7,571,373 B1 | 8/2009 | Danilak |
| 8,001,444 B2 | 8/2011 | Vogan et al. |
| 8,370,703 B2 | 2/2013 | Hwang et al. |
| 8,786,972 B2 | 7/2014 | Grobis et al. |
| 8,930,798 B2 | 1/2015 | Cideciyan et al. |
| 9,093,095 B2 | 7/2015 | Brunnett et al. |
| 9,312,886 B2 | 4/2016 | Patapoutian et al. |
| 2008/0025178 A1 | 1/2008 | Takase et al. |
| 2008/0174908 A1 | 7/2008 | Wang |
| 2015/0019904 A1 | 1/2015 | Cho |
| 2015/0128008 A1 | 5/2015 | Chatradhi et al. |
| 2015/0227422 A1* | 8/2015 | Yochai ............... G06F 11/1076 714/764 |
| 2017/0345456 A1* | 11/2017 | Hassner ............. G06F 11/1076 |

OTHER PUBLICATIONS

Yingquan Wu, Generalized Integrated Interleaving BCH Codes, Information Theory (ISIT), 2016 IEEE International Symposium on, Jul. 10-15, 2016 Barcelona Spain, pp. 1-5, Date added to IEEE Xplore Aug. 11, 2016, IEEE.

* cited by examiner

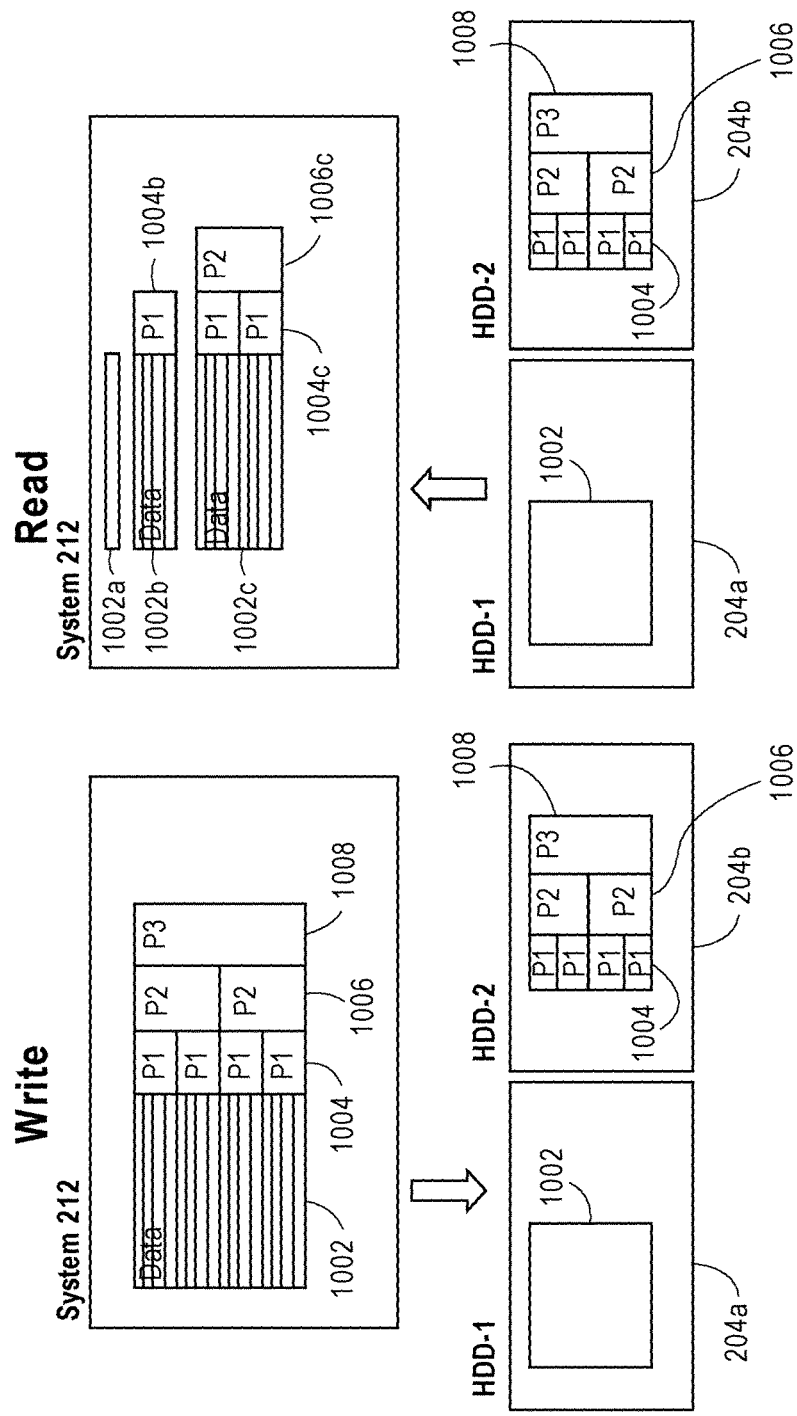

MULTI-LAYER INTEGRATED ZONE PARTITION SYSTEM ERROR CORRECTION

FIELD OF EMBODIMENTS

Embodiments of the invention may relate generally to data storage systems and, more particularly, to a multi-layer error correction coding (ECC) scheme.

BACKGROUND

A hard-disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

Increasing areal density (a measure of the quantity of information bits that can be stored on a given area of disk surface) is one of the ever-present goals of hard disk drive design evolution, and has led to the necessary development and implementation of various means for reducing the disk area needed to record a bit of information. One such development involves the use of a new recording paradigm referred to as shingled magnetic recording (SMR), which utilizes a data writing technique in which data tracks partially overlap, similar to shingles on a roof. Because the data tracks are written to disk sequentially in an overlapping manner, updates of individual tracks or sectors may require a read and rewrite of an entire band of shingled tracks. Furthermore, a "write verify" function, which causes write operations to be verified by an immediate follow-up read operation, may be utilized to ensure data reliability. However, the write verify function decreases write command throughput because of this additional data verification procedure. For example, write command throughput with the write verify function might result in loss of performance of more than 55% as compared to a write operation without the write verify function.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are directed toward a multi-layer error correction coding (ECC) parity technique, and a data storage system employing such a technique for the recovery of corrupt data that was received from a data storage device. A multi-layer ECC parity technique involves dividing a data band into sub-data bands, generating a respective $1^{st}$-layer sub-data band parity matrix for each sub-data band and associating such matrix with the corresponding sub-data band, and generating a respective ($q^{th}$>1)-layer parity matrix for sets of adjacent sub-data bands and associating such matrix with each corresponding set of sub-data bands.

Embodiments in the context of a data storage system, which may contain multiple (e.g., an array of) individual data storage devices (DSD) such as shingled magnetic recording (SMR) hard disk drives (HDD), may include performing the parity generation at the system-side, e.g., by system controller electronics. Hence, the parity information can be communicated and written to one or more of the DSDs along with the corresponding data, whereby the DSDs may further associate conventional track ECC information to the written data. Hence, in response to receiving at the system-side (e.g., in response to a read request to the DSD array) location-identifying information about data errors (e.g., corrupt data) that are not correctable by the DSD using track ECC information, the system controller electronics may determine an amount of the multi-layer parity information that the system may need to recover the corrupt data and make a data/parity read request accordingly.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 10A is a block diagram illustrating a system write with parity operation, according to an embodiment; and FIG. 10B is a block diagram illustrating a system read with parity operation, according to an embodiment.

DETAILED DESCRIPTION

Approaches to a multi-layer error correction coding (ECC) parity technique are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of a data storage device (DSD), or a data storage system in which multiple DSDs such as hard disk drives (HDDs) are employed. Thus, in accordance with an embodiment, a plan view illustrating an HDD 100 is shown in FIG. 1 to illustrate an exemplary operating context.

Figure 1:
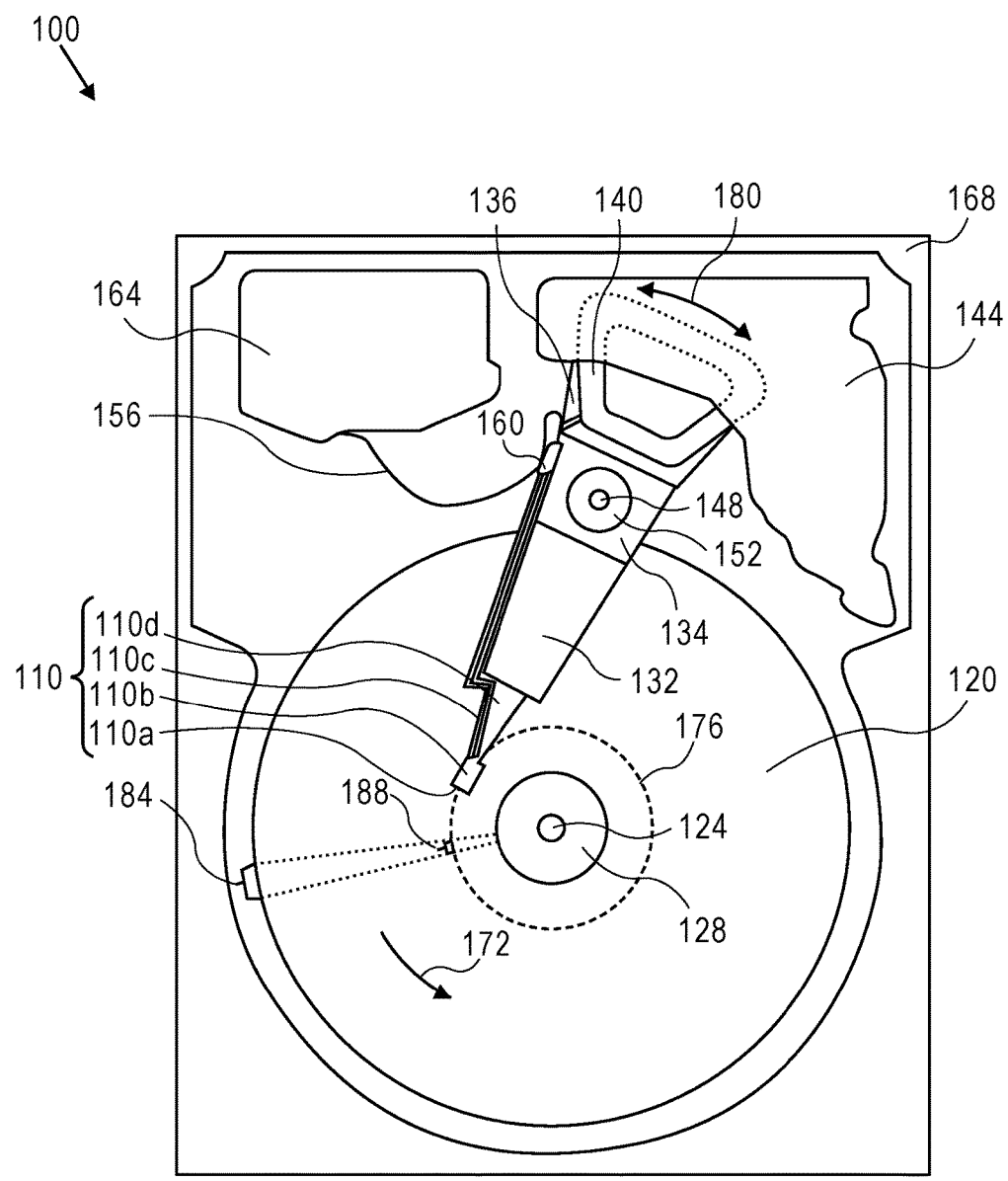
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable"). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically-sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110*b* rides so that the slider 110*b* flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Figure 2:
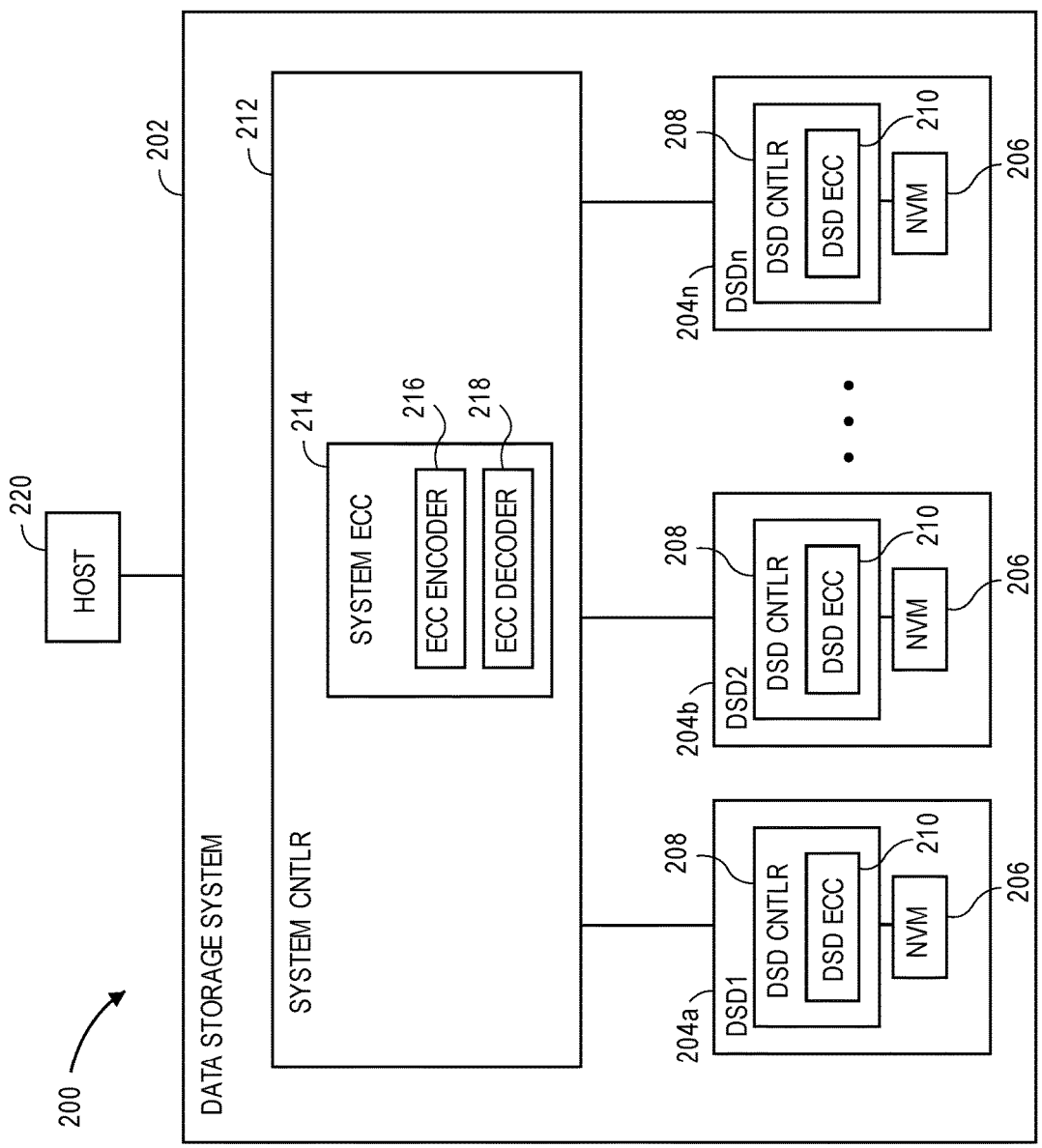
FIG. 2 is a block diagram illustrating a data storage system architecture, according to an embodiment.

There is a commercial demand for high-capacity digital data storage systems, in which multiple data storage devices (DSDs) are housed in a common enclosure. Data storage systems often include large enclosures that house multiple shelves on which rows of DSDs are mounted. FIG. 2 is a block diagram illustrating a data storage system architecture, according to an embodiment. Example architecture 200 illustrates a data storage system 202 that comprises multiple data storage devices (DSDs) 204a (DSD1), 204b (DSD2), and 204n (DSDn), where n represents an arbitrary number of DSDs that may vary from implementation to implementation, under the control of and communicative with a system controller 212. Each DSD 204a, 204b, 204n includes corresponding non-volatile memory (NVM) 206 controlled by a respective DSD controller 208, which includes a DSD ECC module 210. Each DSD ECC module 210 is capable of performing "track ECC" processing, i.e., ECC encoding/decoding at the data track level, using procedures such as those known in the art. System controller 212 includes a system ECC module 214, which includes an ECC encoder 216 and an ECC decoder 218, which represents procedural functionality involving ECC parity encoding and decoding, as described in more detail elsewhere herein. Processing, functions, procedures, actions, method steps, and the like, that are described herein as being performed or performable by system controller 212 may include enactment by execution of one or more sequences of instructions stored in one or more memory units and which, when executed by one or more processors, cause such performance. For example, and according to an embodiment, the system controller 212 comprises an application-specific integrated circuit (ASIC) comprising at least one memory unit for storing such instructions (such as firmware, for a non-limiting example) and at least one processor for executing such instructions, enabling multi-layer ECC parity encoding, decoding, and application to recover corrupt stored data by transforming corrupt or lost data to its original form as write requested.

The data storage system 202 may be communicatively coupled with a host 220, which may be embodied in a hardware machine on which executable code is executable (for non-limiting examples, a computer or hardware server, and the like), or as software instructions executable by one or more processors (for non-limiting examples, a software server such as a database server, application server, media server, and the like). Host 220 generally represents a client of the data storage system 202, and which has the capability to make read and write requests to the data storage system 202. One non-limiting alternative architecture to that illustrated in FIG. 2 envisions the functionality described herein in relation to the system controller 212 as residing elsewhere external to the data storage system 202, such as in a host such as host 220, but communicatively coupled to and having some degree of command control over the array of DSDs 204a, 204b, 204n.

Introduction

Is used herein, the term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Error correction coding (ECC) (or "error correction code", "error-correcting code", etc.) generally refers to schemes, techniques, procedures, encoding/decoding, and the like, for correcting (i.e., reconstructing, or "recovering") corrupt data. Corrupt data is at times the result of incorrect transmission of data or unwanted bit-flips that occur after data is stored in (i.e., written) to non-volatile memory, such as NVM 206 of DSDs 204a, 204b, 204n (FIG. 2). ECC is typically implemented by adding or appending extra data (at times generally referred to as "parity", "parity data", "parity information", "parity bits", and the like) to associated data, so that the data can be recovered even when a number of errors (up to the capability of the parity being used) are introduced into the data.

As discussed, a "write verify" function may be utilized in certain data storage contexts to ensure data reliability (so-called "data integrity"), but can negatively affect system performance by decreasing write command throughput. For example, while shingled magnetic recording (SMR) storage devices may be well-suited for data archival applications (i.e., "cold storage"), in which data access is relatively infrequent, data integrity on par with conventional HDDs is still expected, along with relatively strong performance attributes. Hence, maintaining data integrity has its own trade-offs and challenges, and one may consider committing resources to enhanced ECC schemes to recover corrupt data over committing resources to data integrity at the storage medium. Stated otherwise, one may be willing to accept less data integrity at the storage source, e.g., at the non-volatile memory, in order to increase performance, while relying further on recovery of corrupt data via better more robust ECC schemes.

Multi-Layer Error Correction Coding (ECC) Parity Structure

Figure 3:
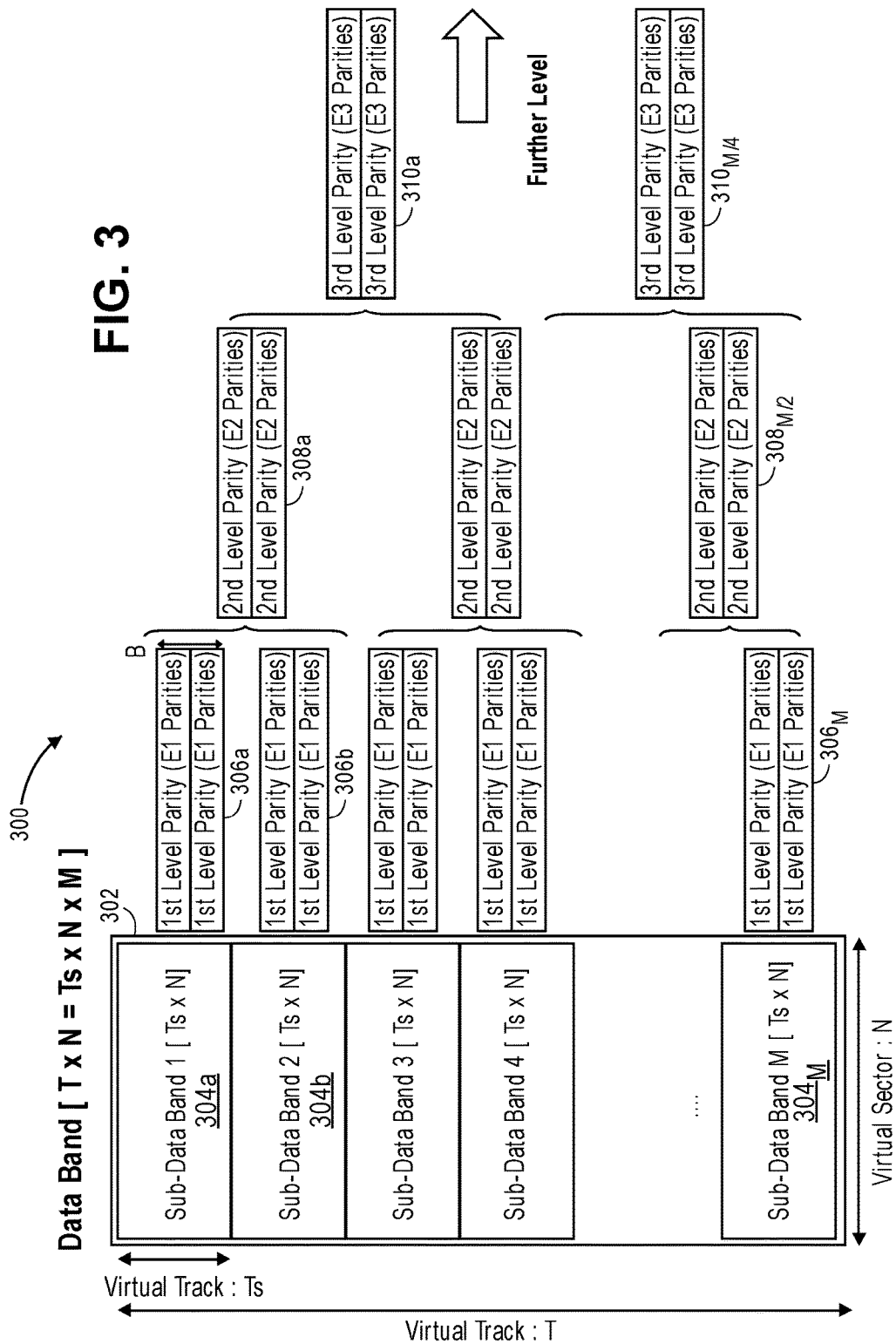
FIG. 3 is a block diagram illustrating a multi-layer integrated zone system error correction coding (ECC) structure, according to an embodiment.

FIG. 3 is a block diagram illustrating a multi-layer integrated zone system error correction coding (ECC) structure, according to an embodiment. The ECC structure 300 depicted in FIG. 3 illustrates a data band 302 having a size [T×N], divided into multiple (M) sub-data bands 304a-304m each having a size [$T_s$×N], where:

T=the number of virtual tracks per data band;
$T_s$=the number of virtual tracks per sub-data band;
N=the number of virtual sectors for both data band and sub-data bands;
M=the number of sub-data bands in one data band (M=T/$T_s$; an integer).

For each sub-band 304a-304m, B number of $1^{st}$-layer parity sets 306a-306m ($E_1$ parities) are generated and associated with respective sub-data bands, where:

B=the number of parity sets (i.e., how many tracks can be correctable at each sub-data band);
E=the number of parity layers per virtual track.

Continuing, for first pairs of sub-data bands, $2^{nd}$-layer parity sets 308a-308$_{M/2}$ ($E_2$ parities) are generated and associated with respective first pairs of sub-data bands; and for groups of four sub-data bands (i.e., two pairs of sub-data bands), $3^{rd}$-layer parity sets 310a-310$_{M/4}$ ($E_3$ parities) are generated and associated with respective second groups of sub-data bands, and so on, where:

Q=the maximum parity layer (where T/$T_s$>=$2^{(Q-1)}$), e.g., T=128, $T_s$=4, Q=6.

The $T_s$, B, $E_q$ parameters can be pre-determined based on a statistical distribution of historical sector errors.

Multi-Layer ECC Parity Generation Technique

Figure 4:
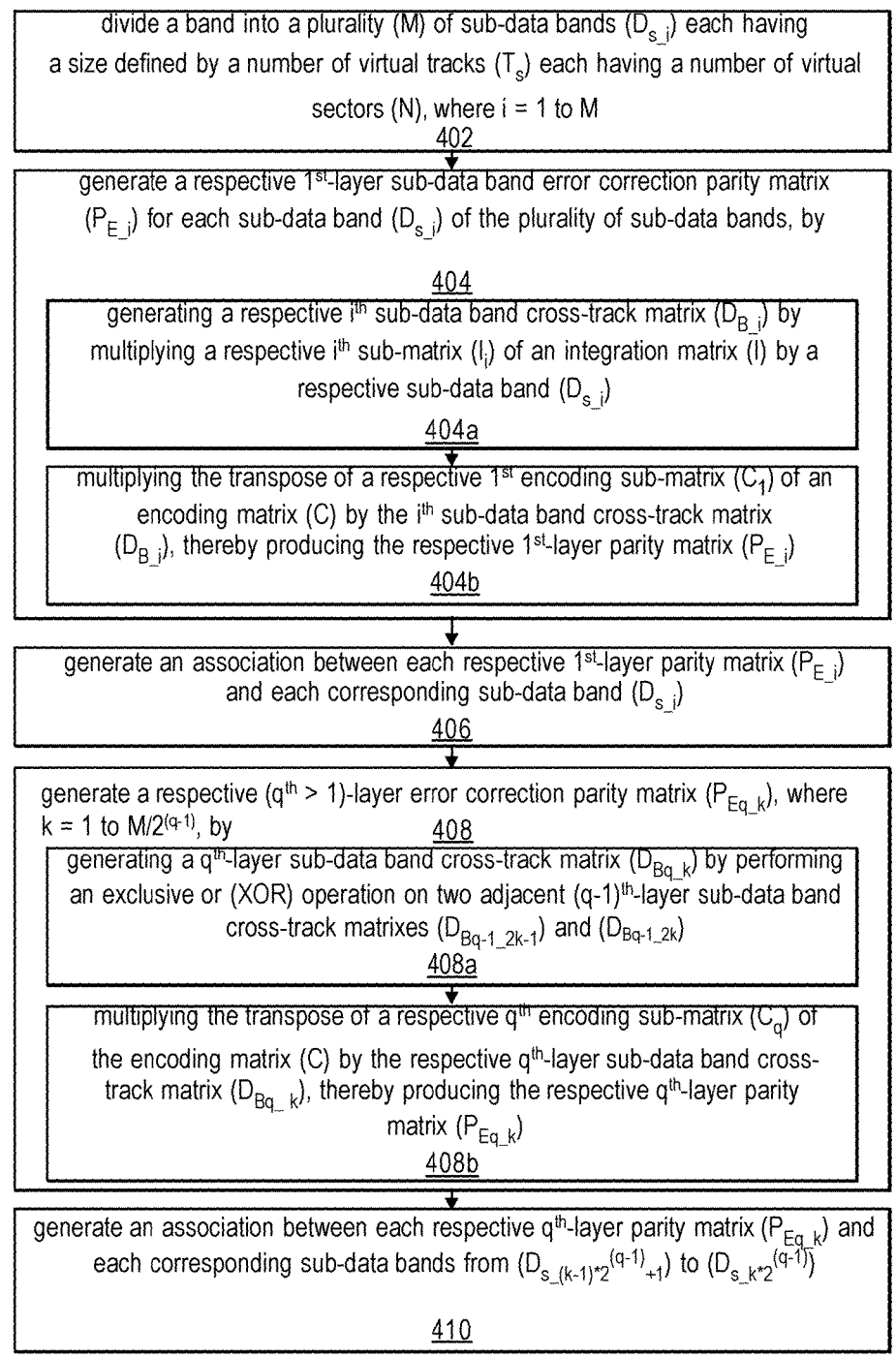
FIG. 4 is a flow diagram illustrating a method for generating error correction coding for recovering corrupt data, according to an embodiment.

FIG. 4 is a flow diagram illustrating a method for generating error correction coding for recovering corrupt data, according to an embodiment. Following a discussion of the flow diagram of FIG. 4, example procedural implementations are described in reference to FIGS. 5A-7B.

At block 402, a data band is divided into a plurality (M) of sub-data bands ($D_{s\_i}$) each having a size defined by a number of virtual tracks ($T_s$) each having a number of virtual sectors (N), where i=1 to M. For example, data band 302 (FIG. 3) is divided into M sub-data bands 304a-304M (FIG. 3).

Figure 5A:
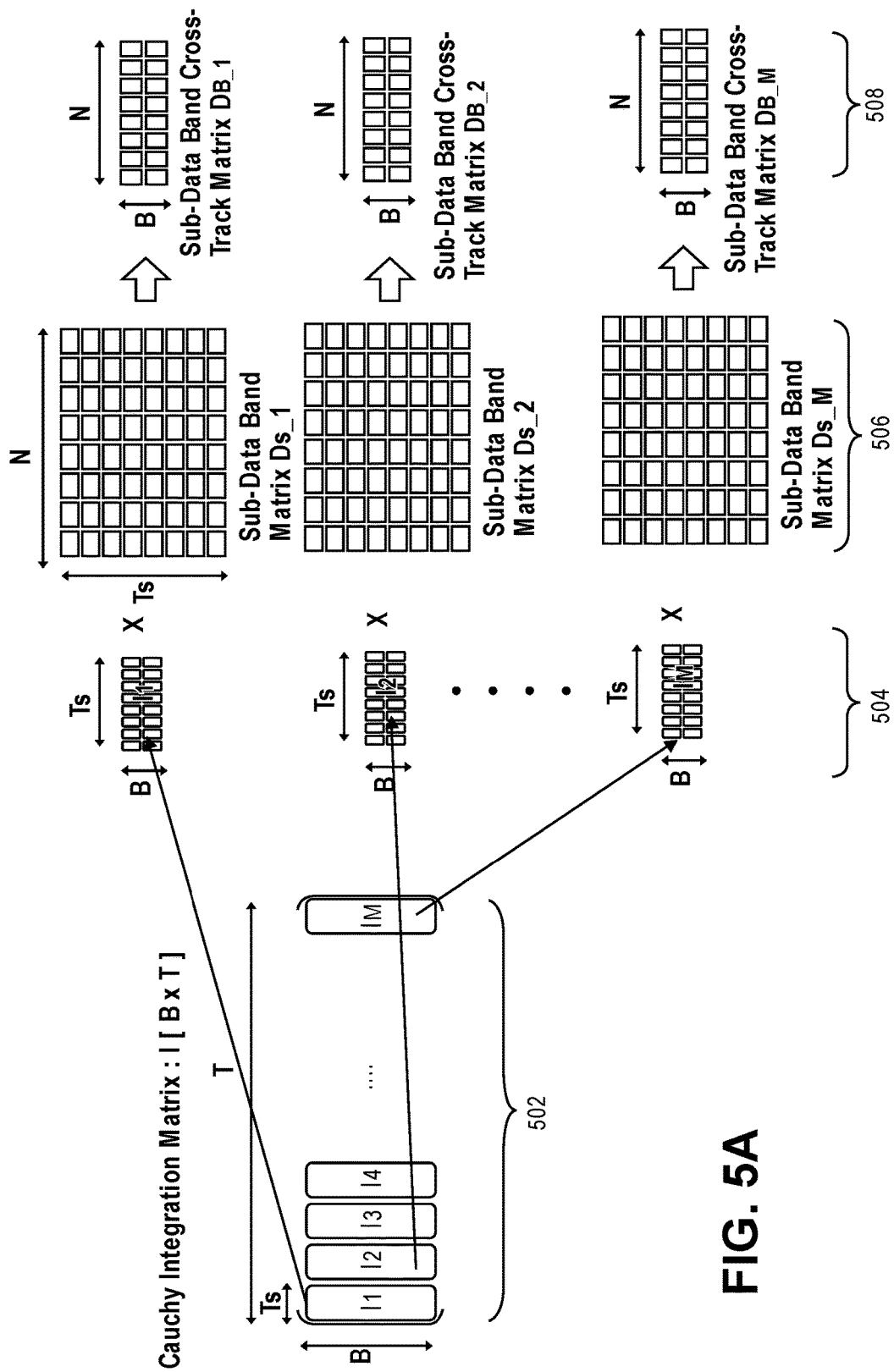
FIG. 5A is a block diagram illustrating a first portion of $1^{st}$-layer ECC parity encoding, according to an embodiment.
Figure 5B:
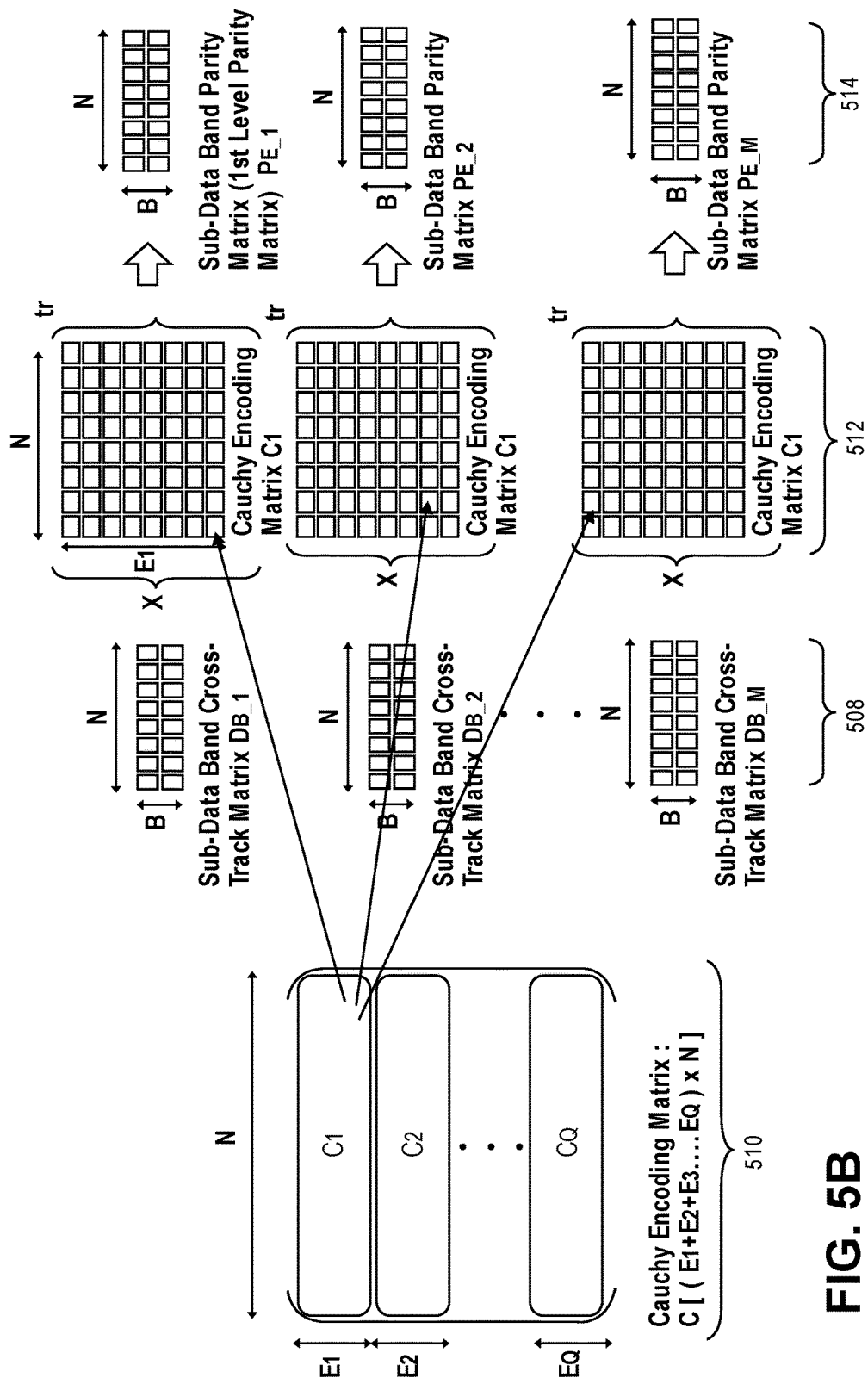
FIG. 5B is a block diagram illustrating a second portion of $1^{st}$-layer ECC parity encoding, according to an embodiment.

At block 404, a respective $1^{st}$-layer sub-data band error correction (ECC) parity matrix ($P_{E\_i}$) is generated for each sub-data band ($D_{s\_i}$) of the plurality of sub-data bands, where i=1 to M. Each sub-data band ECC parity matrix ($P_{E\_i}$) is generated by, at block 404a, generating a respective $i^{th}$ sub-data band cross-track matrix ($D_{B\_i}$) by multiplying a respective $i^{th}$ sub-matrix ($I_i$) of an integration matrix (I) by a respective sub-data band ($D_{s\_i}$), and at block 404b, multiplying the transpose of a respective 1st encoding sub-matrix ($C_1$) of an encoding matrix (C) by the $i^{th}$ sub-data band cross-track matrix ($D_{B\_i}$), thereby producing the respective $1^{st}$-layer parity matrix ($P_{E\_i}$). Reference is made to FIGS. 5A, 5B and the accompanying description for an example of the procedure of block 404, according to an embodiment. At block 406, an association between each respective $1^{st}$-layer parity matrix ($P_{E\_i}$) and each corresponding said sub-data band ($D_{s\_i}$) is generated.

At block 408, a respective ($q^{th}$>1)-layer error correction parity matrix ($P_{Eq\_k}$) is generated, where k=1 to M/$2^{(q-1)}$. Each parity matrix ($P_{Eq\_k}$) is generated by, at block 408a, generating a $q^{th}$-layer sub-data band cross-track matrix ($D_{Bq\_k}$) by performing an "exclusive or" (XOR) operation (also referred to as an exclusive disjunction operation) on two adjacent (q−1)$^{th}$-layer sub-data band cross-track matrices ($D_{Bq-1\_2k-1}$) and ($D_{Bq-1\_2k}$), and at block 408b, multiplying the transpose of a respective $q^{th}$ encoding sub-matrix ($C_q$) of the encoding matrix (C) by the respective $q^{th}$-layer sub-data band cross-track matrix ($D_{Bq\_k}$), thereby producing the respective $q^{th}$-layer parity matrix ($P_{Eq\_k}$). At block 410, an association between each respective $q^{th}$-layer parity matrix ($P_{Eq\_k}$) and each corresponding sub-data bands, from ($D_{s\_(k-1)*2^{(q-1)}+1}$) to ($D_{s\_k*2^{(q-1)}}$), is generated.

According to an embodiment, system controller 212 (FIG. 2) of the data storage system 202 (FIG. 2) performs the process illustrated in FIG. 4. According to a related embodiment, (1) the data band, (2) each respective $1^{st}$-layer sub-data band parity matrix ($P_{E\_i}$) for each said sub-data band ($D_{s\_i}$) generated at block 404, (3) each association between each respective $1^{st}$-layer parity matrix ($P_{E\_i}$) and the corresponding sub-data band ($D_{s\_i}$) generated at block 406, (4) each respective ($q^{th}$>1)-layer parity matrix ($P_{Eq\_k}$) generated at block 408, and each association between each respective $q^{th}$-layer parity matrix ($P_{Eq\_k}$) and (5) each corresponding sub-data bands generated at block 410, are written to one or more of the data storage devices (DSDs) 204a-204n (FIG. 2) of the data storage system 202. According to an embodiment, the data band (e.g., data band 302 of FIG. 3) is written to one DSD 204a-204n while the parity matrices (e.g., $1^{st}$-layer parity sets 306a-306m and $2^{nd}$-layer parity sets 308a-308$_{M/2}$) are written to a different DSD 204a-204n, as illustrated in FIG. 10A.

First-Layer ($E_1$) ECC Parity Encoding

FIG. 5A is a block diagram illustrating a first portion of $1^{st}$-layer ECC parity encoding, according to an embodiment. FIG. 5A correlates to block 404a of FIG. 4, and is referred to here as:

Cross Track Integration for Sub-Data Band Matrix $D_{s\_i}$: [$T_s$×N], where i=1, 2, . . . M, whereby:

Sub-Matrix 504 of Cauchy Integration Matrix $I_i$: [B×$T_s$] 502 multiplied with Sub-Data Band Matrix $D_{s\_i}$: [$T_s$×N] 506 generates Sub-Data Band Cross-Track Matrix $D_{B\_i}$: [B×N] 508. For example, $I_1$×$D_{s\_1}$ generates $D_{B\_1}$, $I_2$×$D_{s\_2}$ generates $D_{B\_2}$, $I_3$×$D_{s\_3}$ generates $D_{B\_3}$ . . . $I_M$×$D_{s\_M}$ generates $D_{B\_M}$.

FIG. 5B is a block diagram illustrating a second portion of $1^{st}$-layer ECC parity encoding, according to an embodiment. FIG. 5B correlates to block 404b of FIG. 4, and is referred to here as:

Sub-Data Matrix Parity Encoding ($1^{st}$-layer Parity Encoding), whereby:

Sub-Data Band Cross-Track Matrix $D_{B\_i}$: [B×N] 508 multiplied with transpose of Sub-Matrix $C_1$: [$E_1$×N] 512 of Cauchy Encoder Matrix C 510 generates Sub-Data Band Parity Matrix ($1^{st}$-layer Parity Matrix) $P_{E\_i}$: [B×$E_1$] 514. For example, $D_{B\_1}$×$C_{1'}$ generates $P_{E\_1}$, $D_{B\_2}$×$C_{1'}$ generates $P_{E\_2}$, $D_{B\_3}$×$C_{1'}$ generates $P_{E\_3}$, . . .

$D_{B\_M} \times C_{1'}$ generates $P_{E\_M}$, where $C_{1'}$ refers to the transpose of $C_1$, and so on.

Thus, each sub-data band is effectively independent of each other, in that $1^{st}$-layer parity can be generated independently for and catenated to each corresponding sub-data band.

Second-Layer ($E_2$) ECC Parity Encoding

Figure 6A:
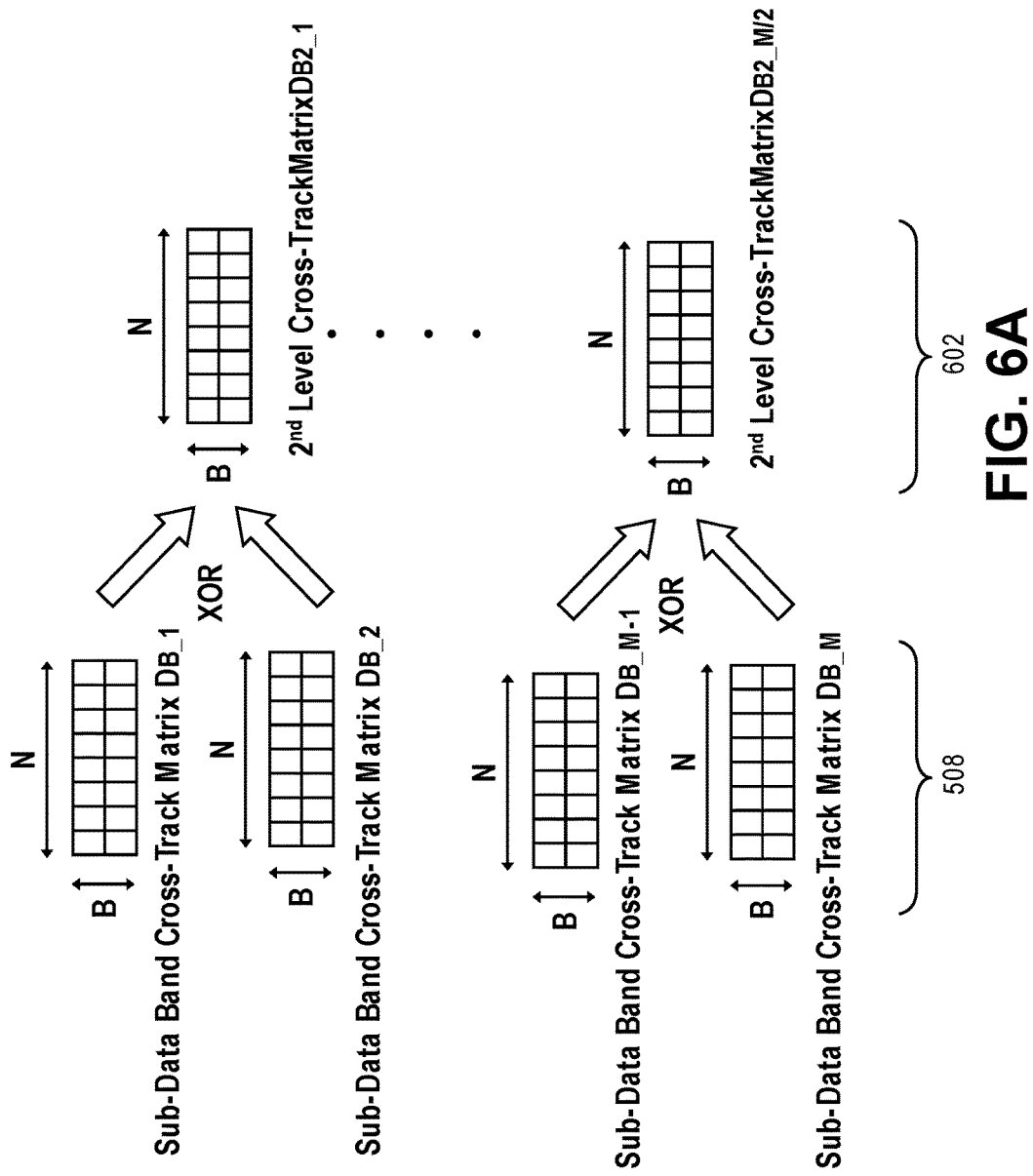
FIG. 6A is a block diagram illustrating a first portion of $2^{nd}$-layer ECC parity encoding, according to an embodiment.

FIG. 6A is a block diagram illustrating a first portion of $2^{nd}$-layer ECC parity encoding, according to an embodiment. FIG. 6A may correlate to block 408a of FIG. 4, and is referred to here as:
Cross Track Integration for two Sub-Data Band Cross-Track Matrices $D_{B\_i}$: [B×N], where i=1, 2, ... M, whereby:
  Exclusive OR (XOR) Operation for two Sub-Data Band Cross-Track Matrices DB_i: [B×N] 508 generates $2^{nd}$-layer Cross-Track Matrix $DB_{2\_j}$: [B×N] 602, where j=1, 2, ... M/2. For example, $XOR(D_{B\_1}, D_{B\_2})$ generates $D_{B2\_1}$, $XOR(D_{B\_3}, D_{B\_4})$ generates $D_{B2\_2}$, ... $XOR(D_{B\_M-1}, D_{B\_M})$ generates $D_{B2\_M/2}$. According to an embodiment, the XOR operation is not limited to operating on adjacent sub-data bands, rather such feature may be programmable, such as according to user preference.

Figure 6B:
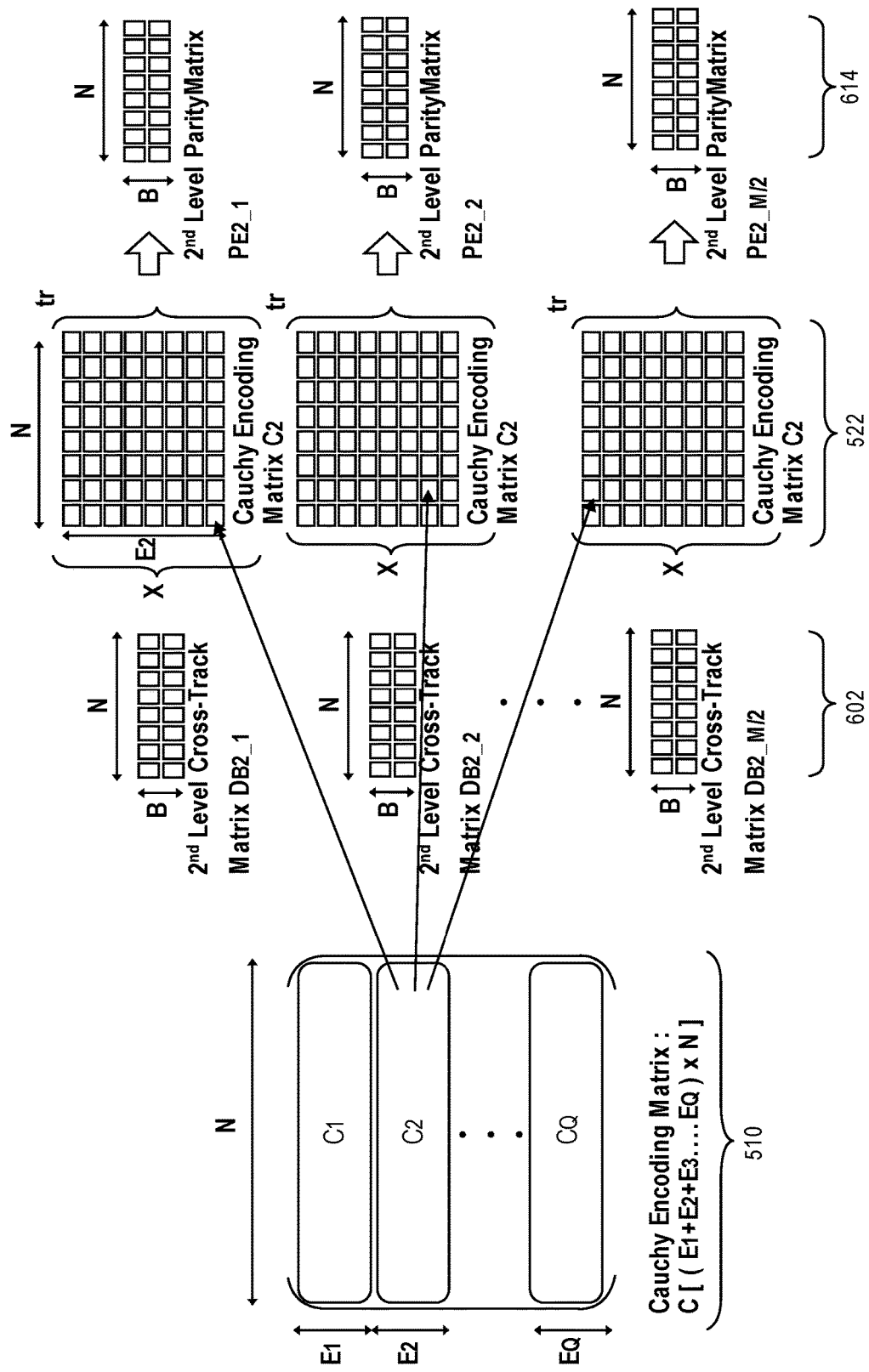
FIG. 6B is a block diagram illustrating a second portion of $2^{nd}$-layer ECC parity encoding, according to an embodiment.

FIG. 6B is a block diagram illustrating a second portion of $2^{nd}$-layer ECC parity encoding, according to an embodiment. FIG. 6B may correlate to block 408b of FIG. 4, and is referred to here as:
$2^{nd}$-layer Parity Encoding, whereby:
  $2^{nd}$-layer Cross-Track Matrix $D_{B2\_j}$: [B×N] 602 multiplied with transpose of Sub-Matrix $C_2$: [$E_2$×N] 522 of Cauchy Encoder Matrix C 510 generates $2^{nd}$-layer Parity Matrix $P_{E2\_j}$: [B×$E_2$] 614. For example, $D_{B2\_1} \times C_{2'}$ generates $P_{E2\_1}$, $D_{B2\_2} \times C_{2'}$ generates $P_{E2\_2}$, $D_{B2\_3} \times C_{2'}$ generates $P_{E2\_3}$, ... $D_{B2\_M/2} \times C_{2'}$ generates $P_{E\_M/2}$, where $C_{2'}$ refers to the transpose of $C_2$, and so on.

Thus, each $2^{nd}$-layer parity can be catenated to either corresponding sub-data band.

$q^{TH}$-Layer ($E_q$) ECC Parity Encoding

Figure 7A:
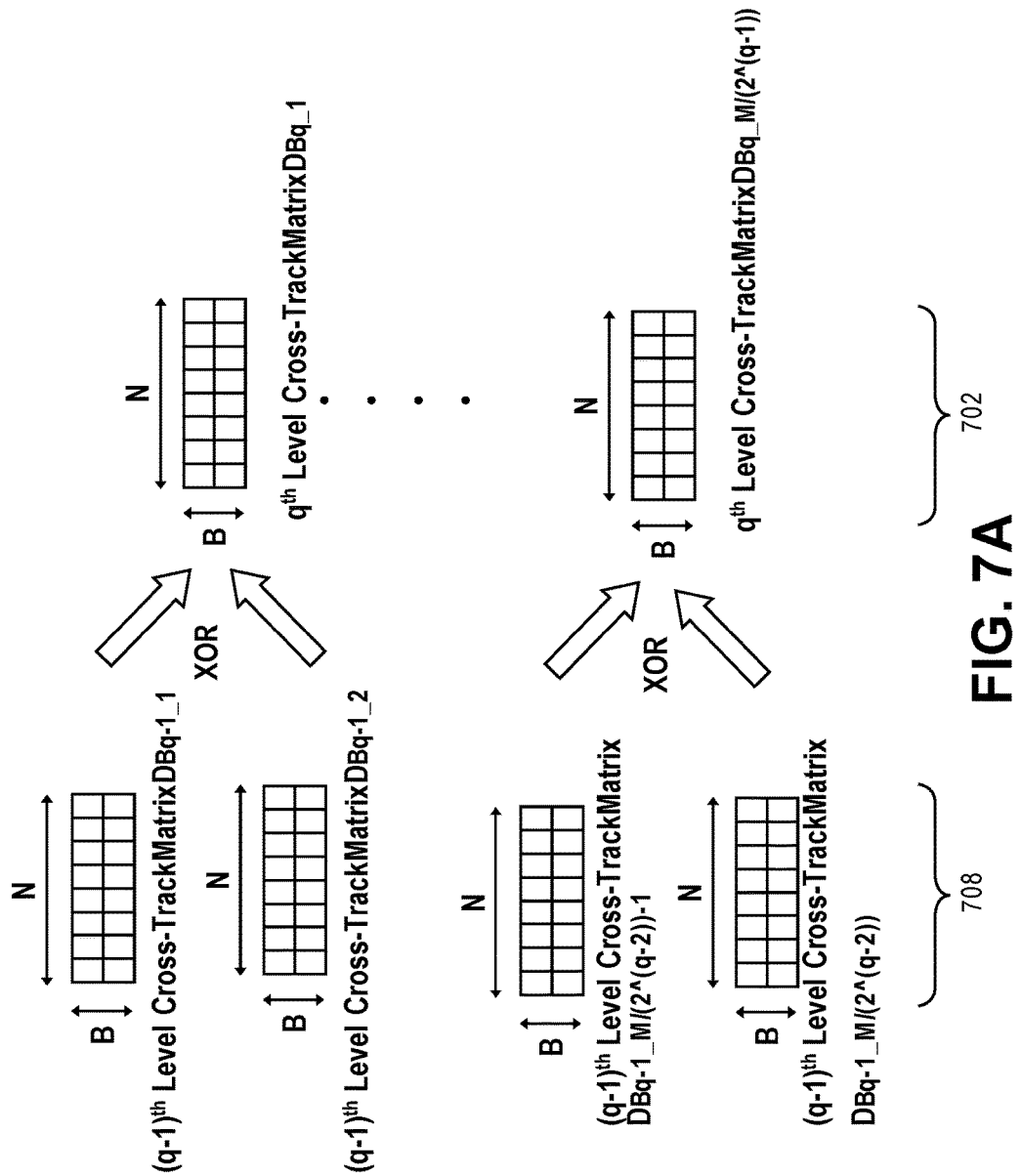
FIG. 7A is a block diagram illustrating a first portion of $q^{th}$-layer ECC parity encoding, according to an embodiment.

FIG. 7A is a block diagram illustrating a first portion of $q^{th}$-layer ECC parity encoding, according to an embodiment. FIG. 7A correlates to block 408a of FIG. 4, is referred to here as:
Cross Track Integration for two $(q-1)^{th}$ layer Cross-Track Matrices $D_{Bq-1\_j}$: [B×N], where j=1, 2, ... M/(2^(q-2)), whereby:
  Exclusive OR (XOR) Operation for two $(q-1)^{th}$ layer Cross-Track Matrices $D_{Bq-1\_j}$: [B×N] 708 makes $q^{th}$ layer Cross-Track Matrix $D_{Bq\_k}$: [B×N] 702, where j=1, 2 ... M/(2^(q-2)), k=1, 2 ... M/(2^(q-1)). For example, $XOR(D_{Bq-1\_1}, D_{Bq-2\_2})$ generates $D_{Bq\_1}$, $XOR(D_{Bq-1\_3}, D_{Bq-1\_4})$ generates $D_{Bq\_2}$, ... XOR $(D_{Bq-1\_M/(2^{(q-2)})-1}, D_{B2\_M/(2^{(q-2)})})$ generates $D_{Bq\_M/(2^{(q-1)})}$. According to an embodiment, the XOR operation is not limited to operating on adjacent sub-data bands, rather such feature may be programmable, such as according to user preference.

Figure 7B:
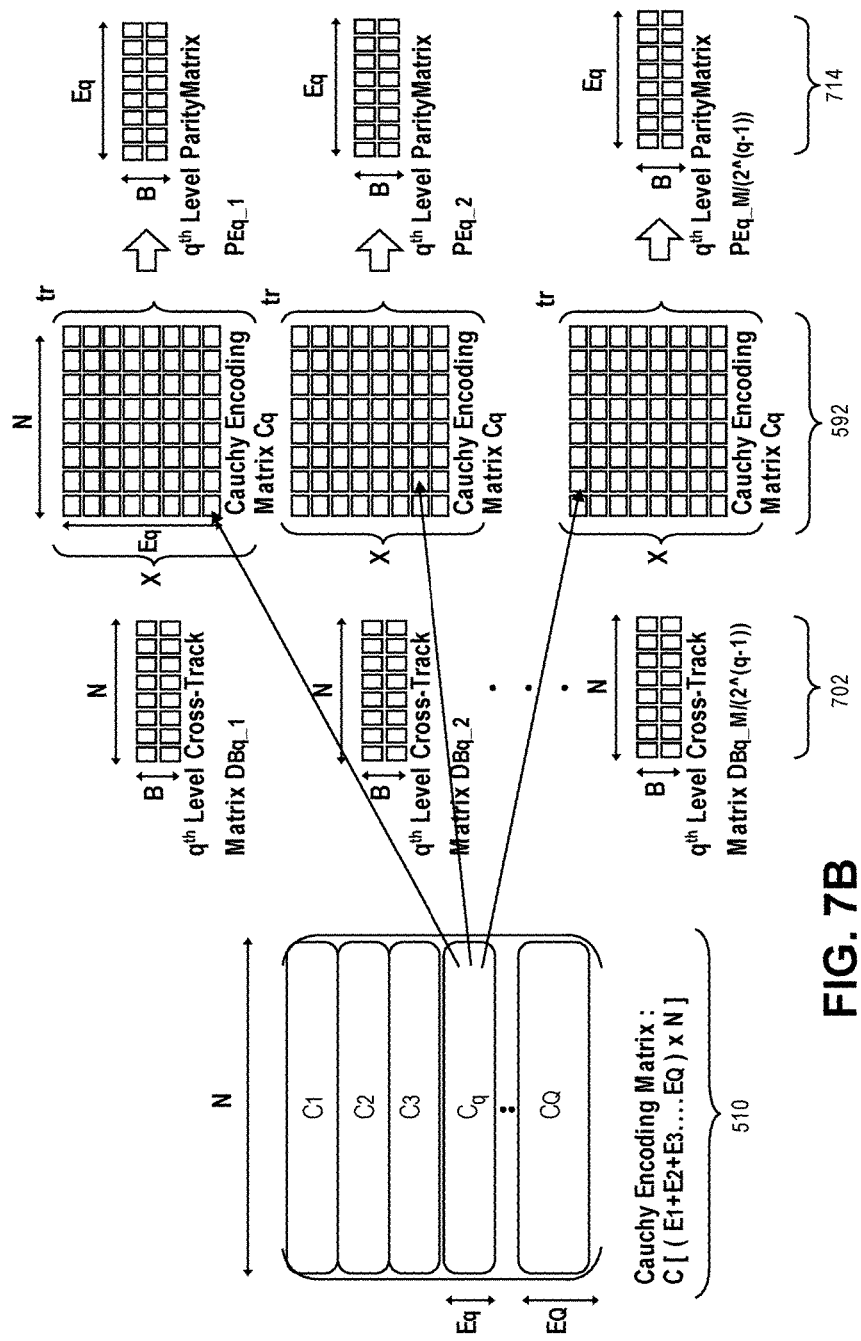
FIG. 7B is a block diagram illustrating a second portion of $q^{th}$-layer ECC parity encoding, according to an embodiment.

FIG. 7B is a block diagram illustrating a second portion of $q^{th}$-layer ECC parity encoding, according to an embodiment. FIG. 7B correlates to block 408b of FIG. 4, and is referred to here as:
$q^{th}$ layer Parity Encoding, whereby:
  $q^{th}$ layer Cross-Track Matrix $D_{Bq\_k}$: [B×N] 702 multiplied with transpose of Cq: [$E_q$×N] 592 of Cauchy Encoder Matrix C 510 generates $q^{th}$ layer Parity Matrix $PE_{q\_k}$: [B×$E_q$] 714, where k=1, 2, ... M/(2^(q-1)). For example, $D_{Bq\_1} \times C_{q'}$ generates $P_{Eq\_1}$, $D_{Bq\_2} \times C_{q'}$ generates $P_{Eq\_2}$, $D_{Bq\_3} \times C_{q'}$ generates $P_{Eq\_3}$, ... $D_{Bq\_M/(2^{(q-1)})} \times C_{q'}$ generates $P_{Eq\_M/(2^{(q-1)})}$, where $C_{q'}$ refers to the transpose of $C_q$.

Without implementation of sub-data bands as described, a read operation would be constrained to reading an entire data band or block. However, with implementation of sub-data bands and multi-layer ECC parity as described, each sub-data band can be associated with corresponding $1^{st}$-layer parity, $2^{nd}$-layer parity, ... $q^{th}$ layer parity, thereby providing a finer layer of granularity and, thus, independence and flexibility, associated with error correction for each sub-data band, while at the same time offering common parity across multiple sub-data bands. Consequently, if a practical data error distribution is such that errors are relatively concentrated, then an entire band or block of data need not be read in order to correct errors within just a limited number of sector(s) of the data block.

First-Layer ($E_1$) ECC Parity Decoding

Figure 8A:
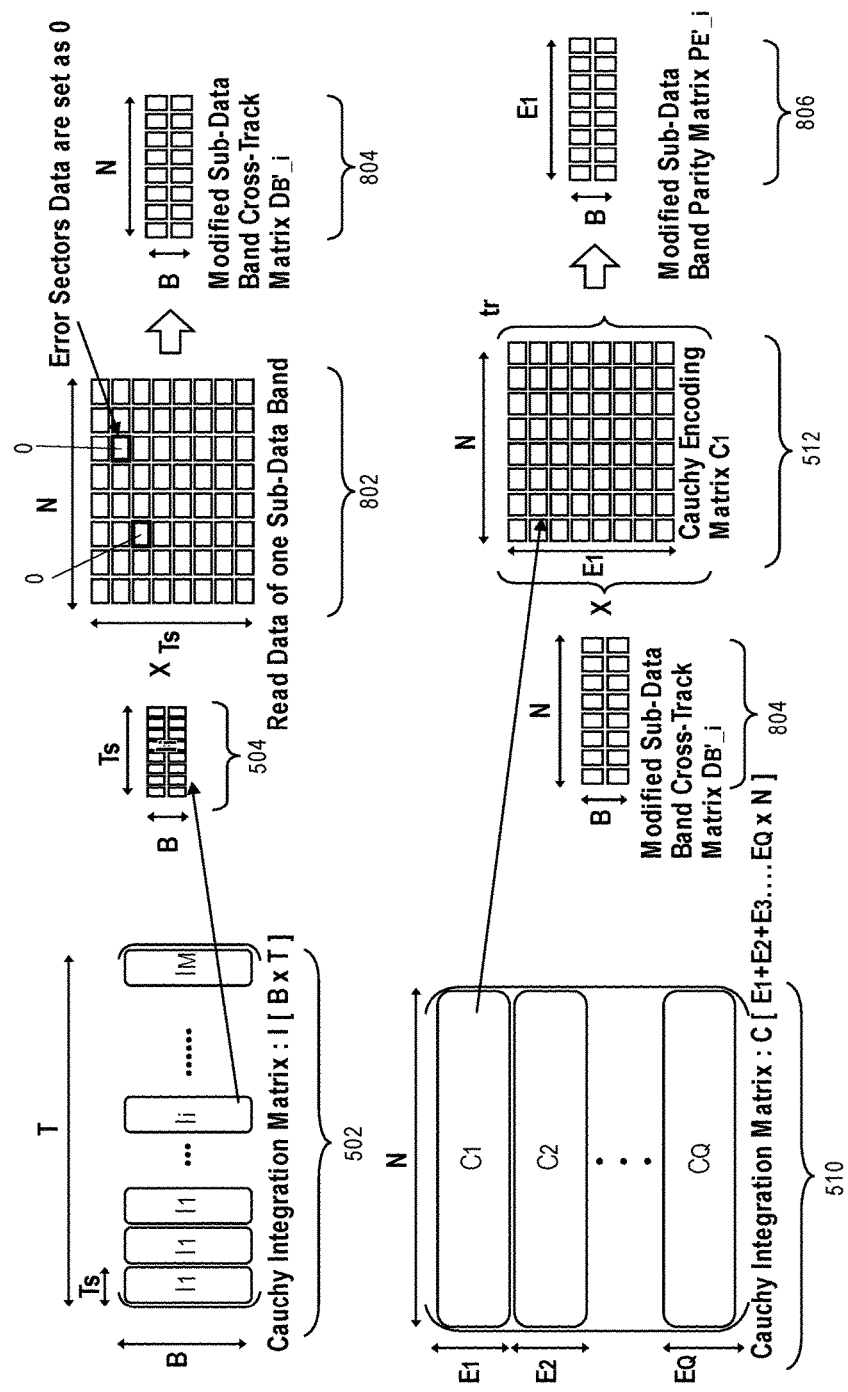
FIG. 8A is a block diagram illustrating a first portion of $1^{st}$-layer ECC parity decoding, according to an embodiment.

FIG. 8A is a block diagram illustrating a first portion of $1^{st}$-layer ECC parity decoding, according to an embodiment. In the event of a read operation corresponding to one sub-data band (e.g., one sub-data band 304a-304M of FIG. 3), this read data with a null at each error sector is referred to as a Sub-Data Band Read Data Matrix $D_{s'\_i}$: [$T_s$×N] 802. For example, system controller 212 (FIG. 2) may request a read operation that involves one or more of the data storage devices 204a, 204b, 204n (FIG. 2), whereby a Sub-Data Band Read Data Matrix 802 is returned to the system controller 212.

FIG. 8A depicts what is referred to here as:
Cross Track Integration for one Sub-Data Band Read Data Matrix $D_{s'\_i}$: [$T_s$×N], whereby:
  Sub-Data Band Read Data Matrix $D_{s'\_i}$: [$T_s$×N] 802 multiplied with the corresponding Sub-Matrix 504 of the Cauchy Integration Matrix I: [B×$T_s$] 502 generates Modified Sub-Data Band Cross-Track Matrix $D_{B'\_i}$: [B×N] 804. For example, $I_i \times D_{s'\_i}$ generates $D_{B'\_i}$.

FIG. 8A further depicts what is referred to here as:
Modified Sub-Data Matrix Parity Calculation ($1^{st}$-layer Modified Parity Calculation), whereby:
  Modified Sub-Data Band Cross-Track Matrix $D_{B'\_i}$: [B×N] 804 is multiplied with transpose of $C_1$: [$E_1$×N] 512 of Cauchy Encoder Matrix C 510, which generates Modified Sub-Data Band Parity Matrix 806 ($1^{st}$-layer Modified Parity Matrix) $P_{E'\_i}$: [B×$E_1$]. For example, $D_{B'\_i} \times C_{1'}$ generates $P_{E'\_i}$, where $C_{1'}$ refers to the transpose of $C_1$.

Figure 8B:
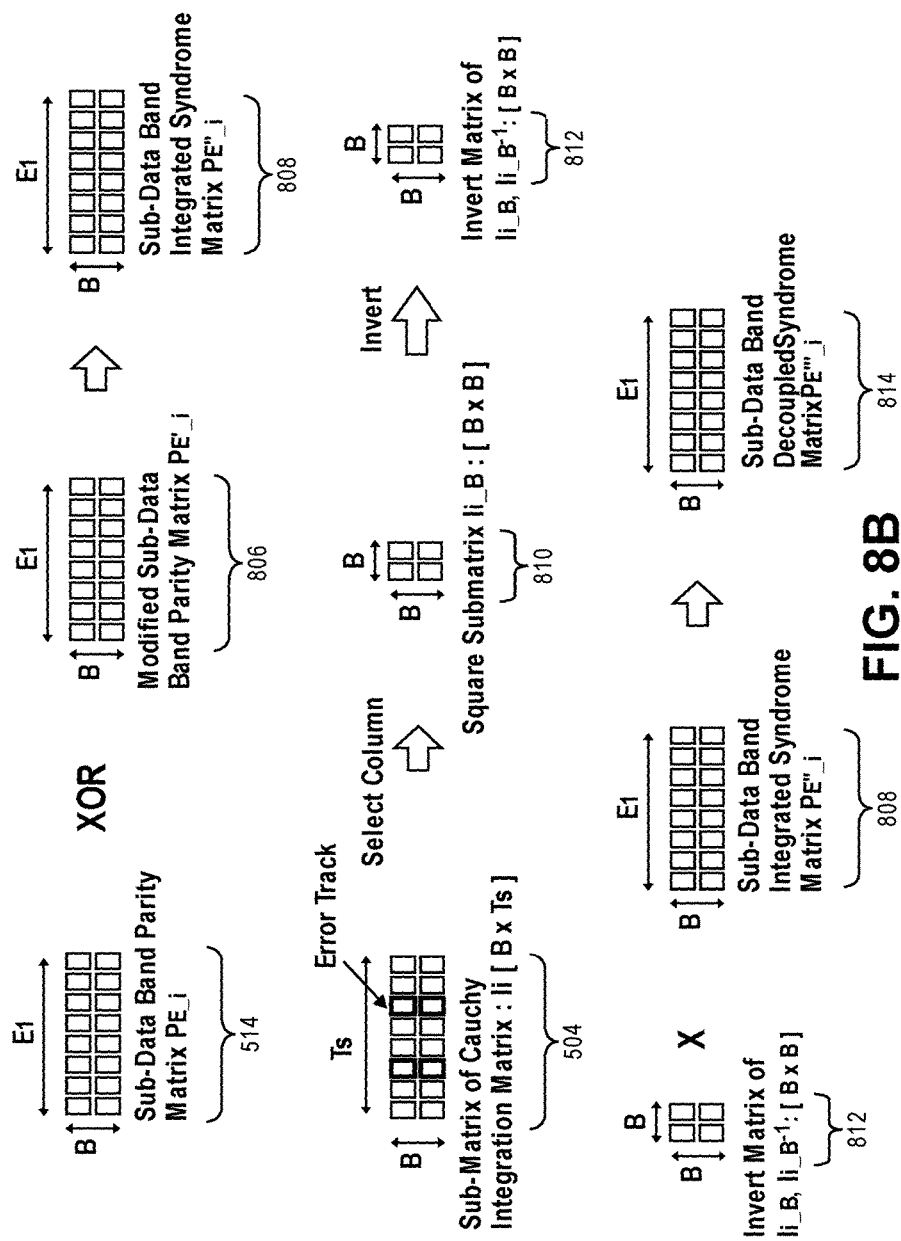
FIG. 8B is a block diagram illustrating a second portion of $1^{st}$-layer ECC parity decoding, according to an embodiment.

FIG. 8B is a block diagram illustrating a second portion of $1^{st}$-layer ECC parity decoding, according to an embodiment. FIG. 8B depicts what is referred to here as: Sub-Data Band Integrated Syndrome Calculation ($1^{st}$-layer Integrated Syndrome Calculation), whereby:
  Exclusive OR (XOR) Sub-Data Band Parity Matrix $P_{E\_i}$: [B×$E_1$] 514 and Modified Sub-Data Band Parity Matrix $P_{E'\_i}$: [B×$E_1$] 806 generates Sub-Data Band Integrated Syndrome Matrix $P_{E''\_i}$: [B×$E_1$] 808.

FIG. 8B further depicts what is referred to here as:
Sub-Data Band Decoupled Syndrome Matrix Calculation ($1^{st}$-layer Decoupled Syndrome Matrix Calculation), whereby:
  Define Square Submatrix $I_{i\_B}$: [B×B] 810 from a Submatrix of Cauchy Integration Matrix $I_i$: [B×$T_s$] 504 (select up to B number of Error Track Columns), and invert this Submatrix 810 to form Invert Matrix $I_{i\_B}$: [B×B] 812. Then multiply Invert Matrix $I_{i\_B}$: [B×B] 812 with the Sub-Data Band Integrated Syndrome Matrix $P_{E''\_i}$: [B×E$_1$] 808 to generate Sub-Data Band Decoupled Syndrome Matrix $P_{E'''\_i}$: [B×E$_1$] 814. Note that each of B-rows of E$_1$-Syndromes is independently decoded to correct B-Error Tracks with, at most, E$_1$-Parities in each.

Figure 8C:
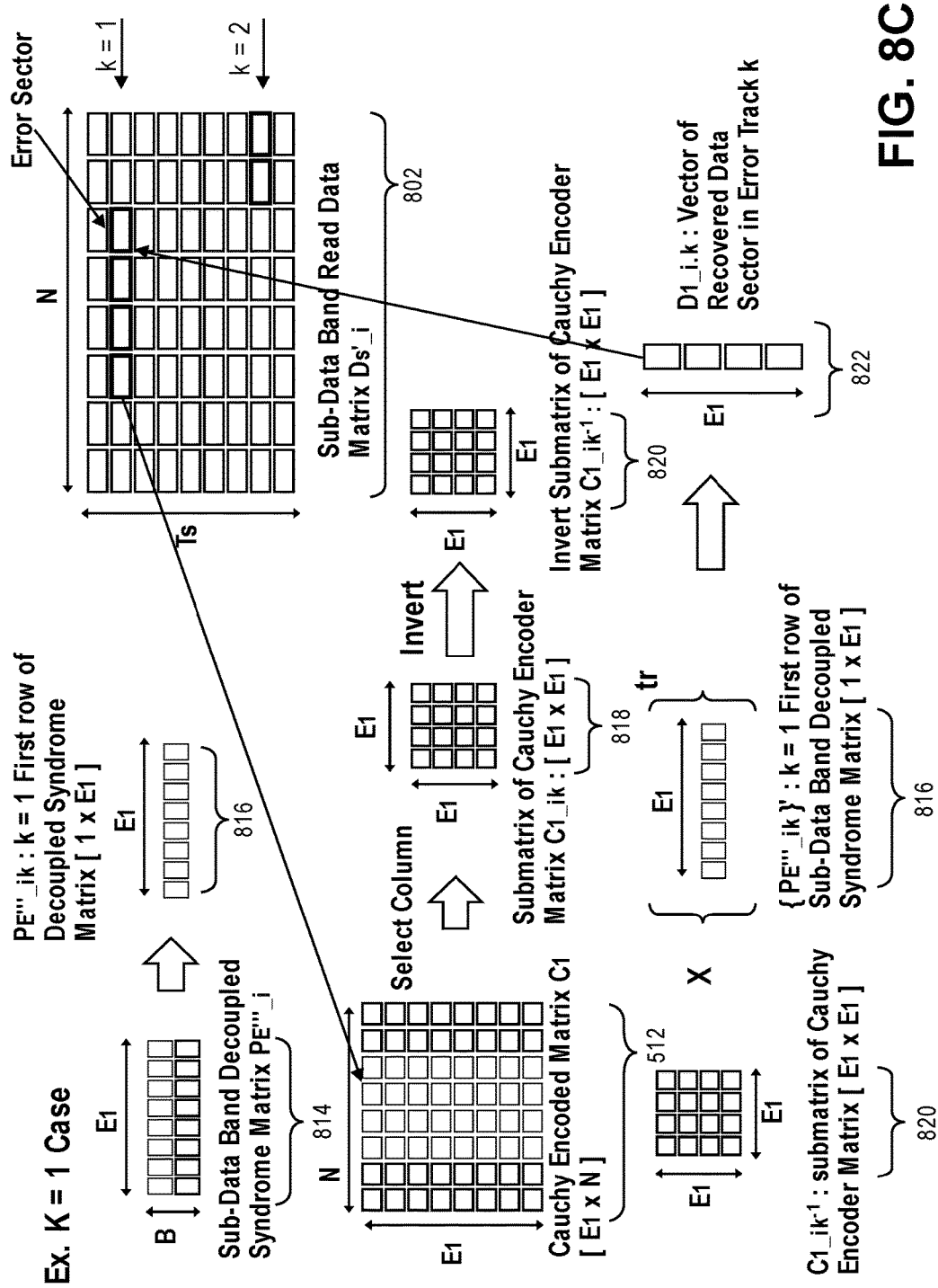
FIG. 8C is a block diagram illustrating a third portion of $1^{st}$-layer ECC parity decoding, according to an embodiment.

FIG. 8C is a block diagram illustrating a third portion of 1$^{st}$-layer ECC parity decoding, according to an embodiment. FIG. 8C depicts what is referred to here as: Error Sector Correction Calculation, whereby:

Define Submatrix $P_{E'''\_ik}$: [1×E$_1$] 816 from Sub-Data Band Decoupled Syndrome Matrix $P_{E'''\_i}$: [B×E$_1$] 814 [$P_{E'''\_i1}, P_{E'''\_i2}, \ldots P_{E'''\_ik}, \ldots P_{E'''\_iB}$, k: Error Track index, up to B]. Define Submatrix $C_{1\_ik}$: [E1×E$_1$] 818 of Cauchy Encoder Matrix $C_1$: [E1×N] 512. Select column from Error Sector at each Error Track k. Invert this Submatrix $C_{1\_ik}$ (guaranteed by Cauchy-RS Structure) 818 to generate $C_{1\_ik}^{-1}$ [$C_{1\_i}, C_{1\_i2}, \ldots C_{1\_iB}$, k: Error Track Index] 820. Multiply $C_{1\_ik}^{-1}$: [E$_1$×E$_1$] 820 with the transpose of $P_{E'''\_ik}$: [E$_1$×1] 816 to generate the Result matrix $D_{1\_ik}$: [E$_1$×1] Vector of Recovered Data Sector in Error Track k [$D_{1\_i1}, D_{1\_i2}, \ldots D_{1\_iB}$] 822.

Second-Layer (E$_2$) ECC Parity Decoding

Figure 9A:
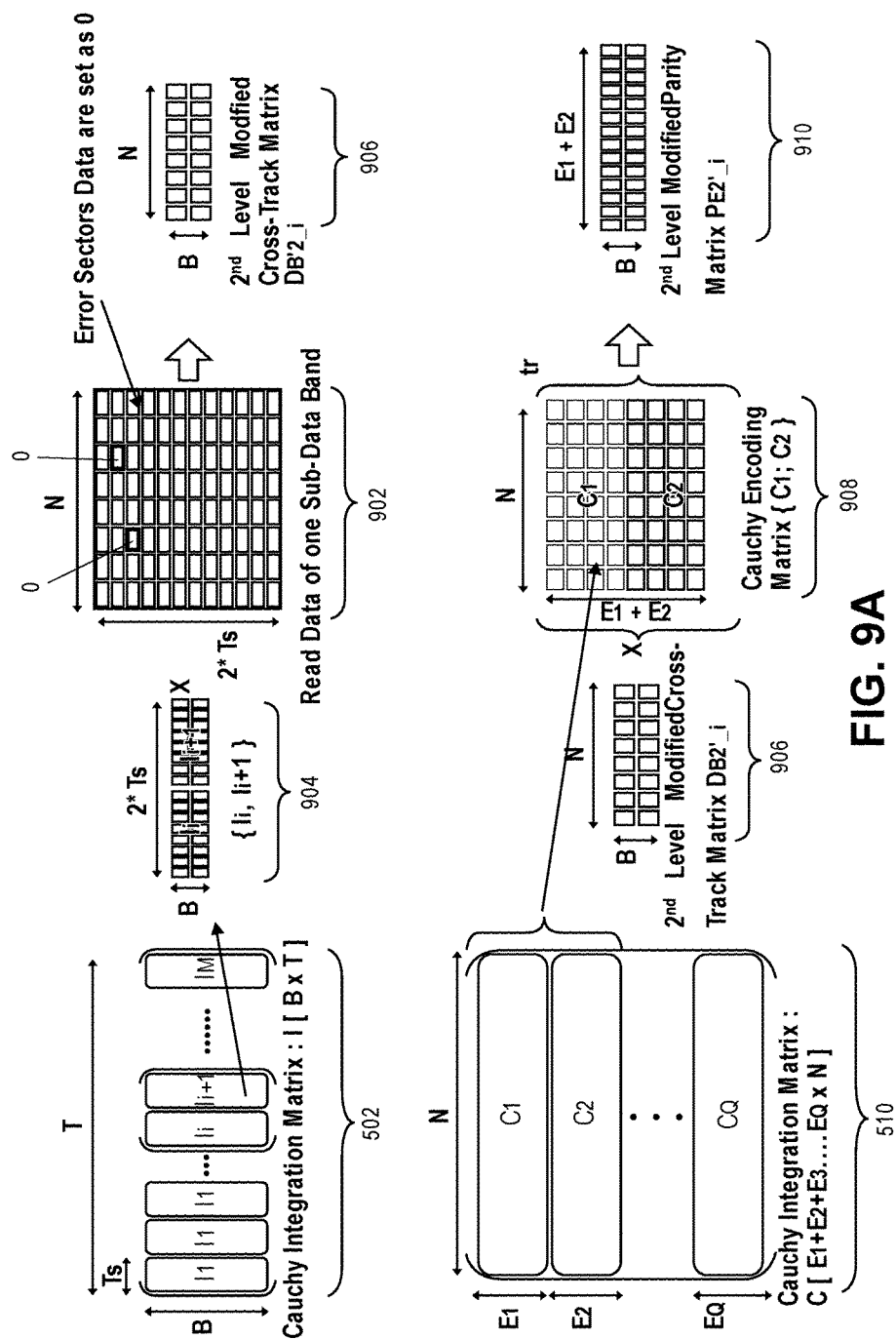
FIG. 9A is a block diagram illustrating a first portion of $2^{nd}$-layer ECC parity decoding, according to an embodiment.

FIG. 9A is a block diagram illustrating a first portion of 2$^{nd}$-layer ECC parity decoding, according to an embodiment. In the event of a read operation corresponding to two sub-data bands (e.g., two sub-data bands 304a-304M of FIG. 3), this read data with a null at each error sector is referred to as a 2$^{nd}$-layer Read Data Matrix $D_{s'2\_i}$: [2*T$_s$×N] 902. For example, system controller 212 (FIG. 2) may request a read operation that involves one or more of the data storage devices 204a, 204b, 204n (FIG. 2), whereby a 2$^{nd}$-layer Read Data Matrix 802 is returned to the system controller 212.

FIG. 9A depicts what is referred to here as:
Cross Track Integration for 2$^{nd}$-layer Read Data Matrix $D_{s'2\_i}$: [2*T$_s$×N], whereby:

A corresponding set of Sub-Matrices {$I_i, I_{i+1}$}: [B×2*T$_s$] 904 of Cauchy Integration Matrix 502 multiplied with 2$^{nd}$-layer Read Data Matrix $D_{s'2\_i}$: [2*T$_s$×N] 902 generates 2$^{nd}$-layer Modified Cross-Track Matrix $D_{B'2\_i}$: [B×N] 906. For example, {$I_i, I_{i+1}$}×$D_{s'2\_i}$ generates $D_{B'2\_i}$.

FIG. 9A further depicts what is referred to here as:
2$^{nd}$-layer Modified Parity Calculation, whereby:

2$^{nd}$-layer Modified Cross-Track Matrix $D_{B'2\_i}$: [B×N] 906 multiplied with the transpose of {C1; C2}: [(E$_1$+E$_2$)×N] Cauchy Encoder Matrix 908, from Cauchy Encoding Matrix C 510, generates 2$^{nd}$-layer Modified Parity Matrix $P_{E'2\_i}$: [B×(E$_1$+E$_2$)] 910. For example, $D_{B'2\_i}$×{C1; C2}$^t$ generates $P_{E'\_i}$.

Figure 9B:
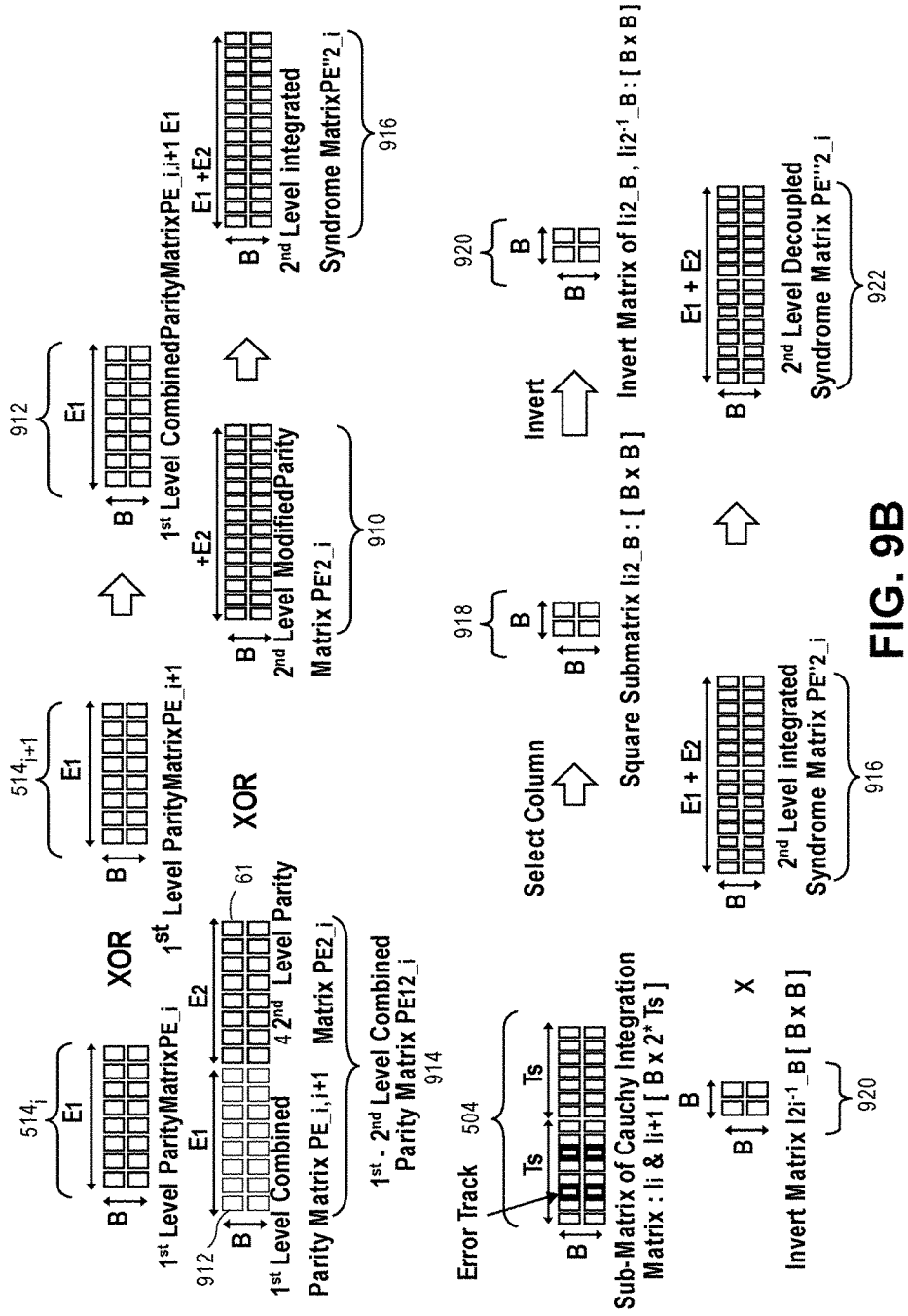
FIG. 9B is a block diagram illustrating a second portion of $2^{nd}$-layer ECC parity decoding, according to an embodiment.

FIG. 9B is a block diagram illustrating a second portion of 2$^{nd}$-layer ECC parity decoding, according to an embodiment. FIG. 9B depicts what is referred to here as:
2$^{nd}$-layer Integrated Syndrome Calculation, whereby:

Exclusive OR (XOR) two 1$^{st}$-layer Parity Matrices $P_{E\_i}$: [B×E$_1$] 514i and $P_{E\_i+1}$: [B×E$_1$] 514$_{i+1}$ generates 1$^{st}$-layer Combined Parity Matrix $P_{E\_i-i+1}$: [B×E$_1$] 912. Concatenating 1$^{st}$-layer Combined Parity Matrix $P_{E\_i-i+1}$: [B×E$_1$] 912 and 2$^{nd}$-layer Parity Matrix $P_{E2\_i}$ 614 in horizontal direction generates 1$^{st}$-2$^{nd}$-layer Combined Parity Matrix $P_{E12\_i}$: [B×(E$_1$+E$_2$)] 914. Exclusive OR (XOR) this 1$^{st}$-2$^{nd}$-layer Combined Parity Matrix $P_{E12\_i}$ 914 and 2$^{nd}$-layer Modified Parity Matrix $P_{2E'\_i}$ 910 generates 2$^{nd}$-layer Integrated Syndrome Matrix $P_{E''2\_i}$ [B×(E$_1$+E$_2$)] 916.

FIG. 9B further depicts what is referred to here as:
2$^{nd}$-layer Decoupled Syndrome Matrix Calculation, whereby:

Define Square Submatrix $I_{i2\_B}$: [B×B] 918 from two Submatrices of Cauchy Integration Matrix $I_i, I_{i+1}$: [B×2*T$_s$] 504 (select up to B number of Error Track Columns), and invert this Submatrix 918 to form Invert Matrix $I_{i2}^{-1}{}_{\_B}$: [B×B] 920. Then multiply Invert Matrix $I_{i2}^{-1}{}_{\_B}$: [B×B] 920 with the 2$^{nd}$-layer Integrated Syndrome Matrix $P_{E''2\_i}$ 916 to generate 2$^{nd}$-layer Decoupled Syndrome Matrix $P_{E'''2\_i}$: [B×(E$_1$+E$_2$] 922. Note that each of B-rows of E$_1$+E$_2$-Syndromes is independently decoded to correct B-Error Tracks with, at most, E$_1$+E$_2$-Parities in each.

Figure 9C:
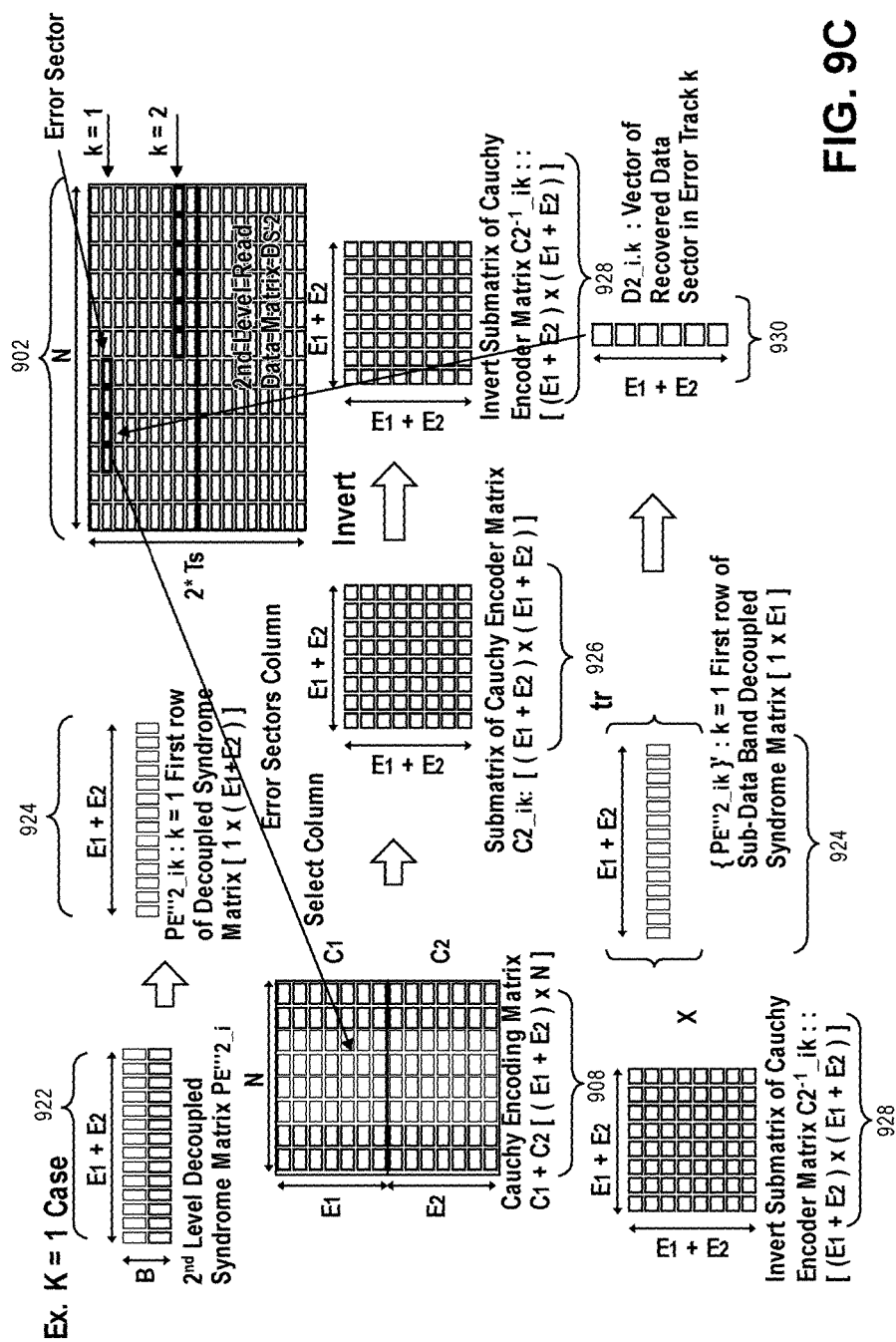
FIG. 9C is a block diagram illustrating a third portion of $2^{nd}$-layer ECC parity decoding, according to an embodiment.

FIG. 9C is a block diagram illustrating a third portion of 2$^{nd}$-layer ECC parity decoding, according to an embodiment. FIG. 9C depicts what is referred to here as:
2$^{nd}$-layer Error Sector Correction Calculation, whereby:

Define Submatrix $P_{E'''2\_ik}$: [1×(E$_1$+E$_2$)] 924 from 2$^{nd}$-layer Decoupled Syndrome Matrix $P_{E'''2\_i}$: [B×(E$_1$+E$_2$)] 922 [$P_{E'''2\_i1}, P_{E'''2\_i2}, \ldots P_{E'''2\_ik}, \ldots P_{E'''2\_iB}$, k: Error Track index, up to B]. Define Submatrix $C_{2\_k}$: [(E$_1$+E$_2$)×(E$_1$+E$_2$)] 926 of Cauchy Encoder Matrix $C_1$+$C_2$: [(E$_1$+E$_2$)×N] 908. Select column from Error Sector at each Error Track k. Invert this Submatrix $C_{2\_ik}$ (guaranteed by Cauchy-RS Structure) 926 to generate $C_{2\_ik}^{-1}$ [$C_{2\_i1}, C_{2\_i2}, \ldots C_{2\_iB}$, k: Error Track Index] 928. Multiply $C_{2\_ik}^{-1}$: [(E$_1$+E$_2$)×(E$_1$+E$_2$)] 928 with the transpose of $P_{E'''2\_ik}$: [(E$_1$+E$_2$)×1] 924 to generate the Result matrix $D_{2\_ik}$: [(E$_1$+E$_2$)×1] Vector of Recovered Data Sector in Error Track k [$D_{2\_i1}, D_{2\_i2}, \ldots D_{2\_iB}$] 930.

According to an embodiment, this decoding scheme may be extended up to q$^{th}$-layer ECC parity decoding, by proceeding similarly to as described in reference to FIGS. 8A-9C. Furthermore, implementation of the ECC parity encoding/decoding schemes described herein into a data storage system may negate the need for system write verify operations.

Write with Parity and Read with Parity Operations

Use of the ECC parity encoding/decoding schemes described herein not only has the potential to eliminate the need for write verify operations, but provides flexibility with data and ECC parity allocations. For example, while a storage system (e.g., data storage system 202 of FIG. 2) may enforce a write data size of a pre-defined fixed value (e.g., 2 MB, 4 MB, . . . 16 MB, . . . 256 MB), the system can determine a read data size with the option of error correction capability, whereby a larger read data size provides more error correction capability.

FIG. 10A is a block diagram illustrating a system write with parity operation, and FIG. 10B is a block diagram illustrating a system read with parity operation, according to embodiments. According to an embodiment ECC encoding/decoding is performed by the system, rather than by the data storage devices. For example, the processing associated with the embodiments described in reference to FIGS. 3-9C may be performed by the system controller 212 (FIG. 2) of data storage system 202 (FIG. 2), rather than by the data storage devices 204a-204n (FIG. 2) of data storage system 202. For example, the processing associated with the embodiments described in reference to FIGS. 3-9C may be performed using one or more memory units and one or more processors within (or communicatively coupled with) the system controller 212, in response to one or more sequences of instructions executed by the one or more processors, where such instructions are embodied within the ECC module 214 (FIG. 2) of the system controller 212.

With reference to FIG. 10A for an example, system controller 212 may enact the multi-layer ECC encoding scheme described in reference to FIGS. 4, 5A, 5B ($1^{st}$-layer parity generation), and up to and including embodiments described in reference to FIGS. 6A, 6B, 7A, 7B ($2^{nd}$-layer to $q^{th}$ layer parity generation). For example, FIG. 10A depicts data 1002 (e.g., one or more data-sub bands 304a-304M of FIG. 3) and associated $1^{st}$-layer parity (P1) 1004, $2^{nd}$-layer parity (P2) 1006, and $3^{rd}$-layer parity (P3) 1008, where three layers of parity are arbitrarily shown for purposes of a non-limiting example. The system controller 212 encodes the ECC parity (P1, P2, P3) for the entire data band 1002 prior to a corresponding write operation. Hence, using a conventional write command the system controller 212 can command, request, or otherwise commence a write operation on the one or more storage devices (DSDs) 204a-204n (FIG. 2) of data storage system 202 (FIG. 2). Furthermore, with reference to FIG. 2, the DSD ECC module 210 of DSDs 204a-204n may further associate conventional track ECC information to the written data 1002.

To reiterate, write data 1002 size is a pre-defined fixed value, such as 2 MB, 4 MB, 16 MB, . . . 256 MB, where a data band is defined by a number of virtual tracks (T) by a number of virtual sectors (N) by a sector size (4096 bytes, for a non-limiting example). As described in reference to FIG. 3, this data band 302 is divided into several sub-data bands 304a-304M, where a sub-data band is defined by a number of virtual tracks ($T_s$) each having the number of sectors (N) and is the minimum data set for ECC parity. According to an embodiment, each of the parameters T, N, and $T_s$ is a programmable value for data storage system 202 (FIG. 2).

According to an embodiment, the DSDs depicted as DSD 204a (HDD-1) and DSD 204n (HDD-2) are the same DSD. According to another embodiment, the DSDs depicted as DSD 204a (HDD-1) and DSD 204n (HDD-2) are different DSDs. Hence, the data 1002 may be written to a first DSD (e.g., HDD-1) of the one or more DSDs 204a-204n of data storage system 202, while at least some of the parity data P1, P2, P3 is written to a different second DSD (e.g., HDD-2) of the one or more DSDs 204a-204n.

As discussed, the ECC parity encoding/decoding schemes described herein provide flexibility with data and ECC parity allocations. Stated otherwise, a flexible read data size with variable ECC "power" (or complexity) is provided for. Hence, the system may read essentially any size of data from data 1002, if there is no error in the data 1002. The system is capable of selecting a read data size based on the extent and distribution of errors within the data 1002 and on the corresponding depth of parity desired, where the minimum read data size is one sector 1002a (with no ECC parity applied), and the maximum read data size is limited to an entire data band 1002 plus all the parity layers P1, P2, P3 (maximum parity), or sizes in between (e.g., sub-data bands 1002b with associated P1 parity 1004b, sub-data bands 1002c with associated P1 1004c and P2 1006c parities, and so on).

As mentioned, in addition to the multi-layer ECC parity described herein, the DSD ECC module 210 of DSDs 204a-204n may further associate conventional track ECC information to the written data 1002. Hence, according to an embodiment, in response to receiving at the system-side (e.g., in response to a read request from the system controller 212 to the DSD 204a-204n array) location-identifying information about data errors at certain sectors that are not correctable by the DSD array using track ECC information (e.g., an uncorrected logical block addressing (LBA) list, which may be embodied as pointers to errors, such as nulls for corrupt sectors), the system controller 212 may determine an amount of the multi-layer parity information that the system may need to recover the corrupt data, and make another data/parity read request accordingly. Thus, if there is a problem with an initial read operation, the system can request more data, which is returned with more ECC parity. Therefore, system controller 212 may enact the multi-layer ECC decoding scheme described in reference to FIGS. 8A-9C ($1^{st}$ and $2^{nd}$-layer parity decoding), and up to and including $q^{th}$ layer parity decoding. That is, the system may apply $1^{st}$-layer parity (P1) to correct up to $E_1$ error sectors in up to B virtual tracks in one sub-data band, or multi-layer parity can be applied in the same way based on how many error sectors are present in up to B virtual tracks in one sub-data band. For example, the system may read two adjacent sub-data bands to perform $2^{nd}$-layer Parity, whereby the system can correct up to $E_1+E_2$ error sectors in up to B tracks within one of these sub-data bands; the system may read four adjacent sub-data blocks to perform $3^{rd}$-layer Parity, whereby the system can correct up to $E_1+E_2+E_3$ error sectors in up to B tracks within one of these sub-data blocks; and so on as the system may read $2^q$ adjacent sub-data bands to perform $q^{th}$ layer Parity, whereby the system can correct up to $E_1+E_2+E_3+ \ldots +E_q$ error sectors in up to B tracks within one of these sub-data bands.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A method comprising:

dividing a data band into a plurality (M) of sub-data bands ($D_{s\_i}$) each having a size defined by a number of virtual tracks ($T_s$) each having a number of virtual sectors (N), where i=1 to M;

generating a respective $1^{st}$-layer sub-data band error correction parity matrix ($P_{E\_i}$) for each said sub-data band ($D_{s\_i}$) of said plurality of sub-data bands, by:

generating a respective $i^{th}$ sub-data band cross-track matrix ($D_{B\_i}$) by multiplying a respective $i^{th}$ sub-matrix ($I_i$) of an integration matrix (I) by a respective sub-data band ($D_{s\_i}$), and multiplying a transpose of a respective $1^{st}$ encoding sub-matrix ($C_1$) of an encoding matrix (C) by said $i^{th}$ sub-data band cross-track matrix ($D_{B\_i}$), thereby producing said respective $1^{st}$-layer parity matrix ($P_{E\_i}$);

generating an association between each said respective $1^{st}$-layer parity matrix ($P_{E\_i}$) and each corresponding said sub-data band ($D_{s\_i}$);

generating a respective ($q^{th}$>1)-layer error correction parity matrix ($P_{Eq\_k}$), where k=1 to $M/2^{(q-1)}$, by:

generating a $q^{th}$-layer sub-data band cross-track matrix ($D_{Bq\_k}$) by performing an exclusive or (XOR) operation on two adjacent $(q-1)^{th}$-layer sub-data band cross-track matrices ($D_{Bq-1\_2k-1}$) and ($D_{Bq-1\_2k}$), and multiplying a transpose of a respective $q^{th}$ encoding sub-matrix ($C_q$) of said encoding matrix (C) by said respective $q^{th}$-layer sub-data band cross-track matrix ($D_{Bq\_k}$), thereby producing said respective qth-layer parity matrix ($P_{Eq\_k}$);

generating an association between each said respective $q^{th}$-layer parity matrix ($P_{Eq\_k}$) and each corresponding said sub-data bands from ($D_{s\_(k-1)*2^{(q-1)}+1}$) to ($D_{s\_k*2^{(q-1)}}$);

writing at least a portion of the following to one or more data storage devices:

said data band, each said respective $1^{st}$-layer sub-data band parity matrix ($P_{E\_i}$) for each said sub-data band ($D_{s\_i}$), each said association between each said respective $1^{st}$-layer parity matrix ($P_{E\_i}$) and said corresponding sub-data band ($D_{s\_i}$), each said respective ($q^{th}$>1)-layer parity matrix ($P_{Eq\_k}$), and each said association between each said respective ($q^{th}$>1)-layer parity matrix ($P_{Eq\_k}$) and each corresponding said sub-data bands from ($D_{s\_(k-1)*2^{(q-1)}+1}$) to ($D_{s\_k*2^{(q-1)}}$);

in response to receiving, from said one or more data storage devices, an indication of uncorrected errors associated with corrupt data from at least one sector corresponding to at least one sub-data band ($D_{s\_i}$) of said data band, determining how much of said $1^{st}$-layer sub-data band parity matrix ($P_{E\_i}$) and/or said ($q^{th}$>1)-layer parity matrix ($P_{Eq\_k}$) is needed to recover said corrupt data; and requesting a read of less than the entire said data band but including said at least one sub-data band ($D_{s\_1}$) containing said corrupt data and at least some of said $1^{st}$-layer sub-data band parity matrix ($P_{E\_i}$) and/or said ($q^{th}$>1)-layer parity matrix ($P_{Eq\_k}$) based on said determining.

2. The method of claim 1, wherein said writing includes:

writing said data band to a first data storage device of said one or more data storage devices; and writing at least some of said $1^{st}$-layer sub-data band parity matrix ($P_{E\_i}$) and said ($q^{th}$>1)-layer parity matrix ($P_{Eq\_k}$) to a second data storage device that is different from said first data storage device.

3. The method of claim 1, further comprising:

recovering said corrupt data based on said at least one sub-data band ($D_{s\_1}$) containing said corrupt data and at least some of said $1^{st}$-layer sub-data band parity matrix ($P_{E\_i}$) and/or said ($q^{th}$>1)-layer parity matrix ($P_{Eq\_k}$).

4. A data storage system comprising:

one or more data storage devices; and a system controller embodying one or more sequences of instructions which, when executed by one or more processors, cause performance of:

with a data band having a size defined by a number of virtual tracks (T) each having a number of virtual sectors (N), dividing said data band into a plurality (M) of sub-data bands ($D_{s\_i}$) each having a size defined by a number of virtual tracks ($T_s$) each having said number of virtual sectors (N), generating a first first-layer sub-data band error correction parity matrix ($P_{E\_1}$) for a first sub-data band ($D_{s\_1}$) of said plurality of sub-data bands by:

generating a first sub-data band cross-track matrix ($D_{B\_1}$) by matrix multiplying a first sub-matrix ($I_1$) of an integration matrix ($I_i$) by said first sub-data band ($D_{s\_1}$), and matrix multiplying a transpose of a first encoding sub-matrix ($C_1$) of an encoding matrix (C) by said first sub-data band cross-track matrix ($D_{B\_1}$), thereby producing said first first-layer sub-data band error correction parity matrix ($P_{E\_1}$), storing an association of said first first-layer sub-data band error correction parity matrix ($P_{E\_1}$) with said first sub-data band ($D_{s\_1}$), generating a second first-layer sub-data band error correction parity matrix ($P_{E\_2}$) for a second sub-data band ($D_{s\_2}$) of said plurality of sub-data bands by:

generating a second sub-data band cross-track matrix ($D_{B\_2}$) by matrix multiplying a second sub-matrix ($I_2$) of said integration matrix ($I_i$) by second sub-data band ($D_{s\_2}$), and matrix multiplying said transpose of said first encoding sub-matrix ($C_1$) by said second sub-data band cross-track matrix ($D_{B\_2}$), thereby producing said second first-layer sub-data band error correction parity matrix ($P_{E\_2}$), storing an association of said second first-layer sub-data band error correction parity matrix ($P_{E\_2}$) with said second sub-data band ($D_{s\_2}$), generating a first second-layer error correction parity matrix ($P_{E2\_1}$) by:

generating a first second-layer sub-data band cross-track matrix ($D_{B2\_1}$) by performing an exclusive or (XOR) operation on said first sub-data band cross-track matrix ($D_{B\_1}$) and said second sub-data band cross-track matrix ($D_{B\_2}$), and matrix multiplying a transpose of a second encoding sub-matrix ($C_2$) of said encoding matrix (C) by said first second-layer sub-data band cross-track matrix ($D_{B2\_1}$), thereby producing said first second-layer error correction parity matrix ($P_{E2\_1}$), and storing an association of said first second-layer error correction parity matrix ($P_{E2\_1}$) with each of said first sub-data band ($D_{s\_1}$) and said second sub-data band ($D_{s\_2}$).

5. The data storage system of claim 4, wherein said one or more data storage devices comprise shingled magnetic recording (SMR) hard disk drives.

6. The data storage system of claim 4, wherein said one or more sequences of instructions cause further performance of:
  writing at least the following to one or more of said one or more data storage devices:
    said first sub-data band ($D_{s\_1}$),
    said first first-layer sub-data band error correction parity matrix ($P_{E\_1}$),
    said association of said first first-layer sub-data band error correction parity matrix ($P_{E\_1}$) with said first sub-data band ($D_{s\_1}$),
    said second sub-data band ($D_{s\_2}$),
    said second first-layer sub-data band error correction parity matrix ($P_{E\_2}$),
    said association of said second first-layer sub-data band error correction parity matrix ($P_{E\_2}$) with said second sub-data band ($D_{s\_2}$), and
    said association of said first second-layer error correction parity matrix ($P_{E2\_1}$) with each of said first sub-data band ($D_{s\_1}$) and said second sub-data band ($D_{s\_2}$).

7. The data storage system of claim 6, wherein said writing includes:
  writing said first sub-data band ($D_{s\_1}$) and said second sub-data band ($D_{s\_2}$) to a first data storage device of said one or more data storage devices; and
  writing said first first-layer sub-data band error correction parity matrix ($P_{E\_1}$), said second first-layer sub-data band error correction parity matrix ($P_{E\_2}$), and said first second-layer error correction parity matrix ($P_{E2\_1}$) to a second data storage device of said one or more data storage devices that is different from said first data storage device.

8. The data storage system of claim 6, wherein said writing includes writing all of said sub-data bands and parity matrices to a single data storage device of said one or more data storage devices.

9. The data storage system of claim 6, wherein said one or more sequences of instructions cause further performance of:
  requesting a read of said data band; and
  in response to receiving, from said one or more data storage devices, an indication of uncorrected errors associated with at least one sector corresponding to said first sub-data band ($D_{s\_1}$), requesting a read of less than the entire said data band but including said first sub-data band ($D_{s\_1}$) and said first first-layer sub-data band error correction parity matrix ($P_{E\_1}$).

10. The data storage system of claim 6, wherein said one or more sequences of instructions cause further performance of:
  requesting a read of said data band; and
  in response to receiving, from said one or more data storage devices, an indication of uncorrected errors associated with said first sub-data band ($D_{s\_1}$) and/or said second sub-data band ($D_{s\_2}$), requesting a read of less than the entire said data band but including said first sub-data band ($D_{s\_1}$), said second sub-data band ($D_{s\_2}$), said first first-layer sub-data band error correction parity matrix ($P_{E\_1}$), said second first-layer sub-data band error correction parity matrix ($P_{E\_2}$), and said first second-layer error correction parity matrix ($P_{E2\_1}$).

11. The data storage system of claim 6, wherein said one or more sequences of instructions cause further performance of:
  requesting a read of said data band; and
  in response to receiving an indication of uncorrected errors associated with one or more sectors of said first sub-data band ($D_{s\_1}$) and/or said second sub-data band ($D_{s\_2}$), and wherein each of said one or more sectors is returned with a respective null, recovering data from said one or more sectors based on:
    said first sub-matrix ($I_1$) and said second sub-matrix ($I_2$) of said integration matrix (I),
    said transpose of said first encoding sub-matrix ($C_1$) and said transpose of said second encoding sub-matrix ($C_2$) of said encoding matrix (C), and
    said first first-layer sub-data band error correction parity matrix ($P_{E\_1}$), said second first-layer sub-data band error correction parity matrix ($P_{E\_2}$), and said first second-layer error correction parity matrix ($P_{E2\_1}$).

12. The data storage system of claim 6, wherein:
  said one or more data storage devices comprise shingled magnetic recording (SMR) hard disk drives; and
  said writing includes writing without a corresponding write verify operation.

13. The data storage system of claim 4, wherein said system controller comprises an application-specific integrated circuit (ASIC).

14. An electronic data storage system controller manufacture embodying one or more sequences of instructions which, when executed by one or more processors, cause performance of:
  dividing a data band into a plurality (M) of sub-data bands ($D_{s\_i}$) each having a size defined by a number of virtual tracks ($T_s$) each having a number of virtual sectors (N), where i=1 to M,
  generating a respective $1^{st}$-layer sub-data band error correction parity matrix ($P_{E\_i}$) for each said sub-data band (D) of said plurality of sub-data bands, by:
    generating a respective $i^{th}$ sub-data band cross-track matrix ($D_{B\_i}$) by multiplying a respective $i^{th}$ sub-matrix ($I_i$) of an integration matrix (I) by a respective sub-data band ($D_{s\_i}$), and
    multiplying a transpose of a respective $1^{st}$ encoding sub-matrix ($C_1$) of an encoding matrix (C) by said $1^{th}$ sub-data band cross-track matrix ($D_{B\_i}$), thereby producing said respective $1^{st}$-layer parity matrix ($P_{E\_i}$);
  generating an association between each said respective $1^{st}$-layer parity matrix ($P_{E\_i}$) and each corresponding said sub-data band ($D_{s\_i}$);
  generating a respective (qth>1)-layer error correction parity matrix ($P_{Eq\_k}$), where k=1 to $M/2^{(q-1)}$, by:
    generating a $q^{th}$-layer sub-data band cross-track matrix ($D_{Bq\_k}$) by performing an exclusive or (XOR) operation on two adjacent $(q-1)^{th}$-layer sub-data band cross-track matrices ($D_{Bq-1\_2k-1}$) and ($D_{Bq-1\_2k}$), and
    multiplying a transpose of a respective $q^{th}$ encoding sub-matrix ($C_q$) of said encoding matrix (C) by said respective $q^{th}$ layer sub-data band cross-track matrix ($D_{Bq\_k}$), thereby producing said respective $q^{th}$-layer parity matrix ($P_{Eq\_k}$); and generating an association between each said respective $q^{th}$-layer parity matrix ($P_{Eq\_k}$) and each corresponding said sub-data bands from ($D_{s\_(k-1)*2}^{(q-1)}$) to ($D_{s\_k*2}^{(q-1)}$).

15. The electronic data storage system controller manufacture of claim 14, wherein said one or more sequences of instructions cause further performance of:
writing at least a portion of the following to one or more data storage devices:
said data band,
each said respective $1^{st}$-layer sub-data band parity matrix ($P_{E\_i}$) for each said sub-data band ($D_{s\_i}$),
each said association between each said respective $1^{st}$-layer parity matrix ($P_{E\_i}$) and said corresponding sub-data band ($D_{s\_i}$),
each said respective ($q^{th}$>1)-layer parity matrix ($P_{Eq\_k}$), and
each said association between each said respective ($q^{th}$>1)-layer parity matrix ($P_{Eq\_k}$) and each corresponding said sub-data bands from ($D_{s\_(k-1)*2}^{(q-1)}$) to ($D_{s\_k*2}^{(q-1)}$).

16. The electronic data storage system controller manufacture of claim 15, wherein said one or more sequences of instructions cause further performance of:
in response to receiving, from said one or more data storage devices, an indication of uncorrected errors associated with corrupt data from at least one sector corresponding to at least one sub-data band ($D_{s\_i}$) of said data band, determining how much of said $1^{st}$-layer sub-data band parity matrix ($P_{E\_i}$) and/or said ($q^{th}$>1)-layer parity matrix ($P_{Eq\_k}$) is needed to recover said corrupt data; and
requesting a read of less than the entire said data band but including said at least one sub-data band ($D_{s\_1}$) containing said corrupt data and at least some of said $1^{st}$-layer sub-data band parity matrix ($P_{E\_i}$) and/or said ($q^{th}$>1)-layer parity matrix ($P_{Eq\_k}$) based on said determining.

17. The electronic data storage system controller manufacture of claim 15, wherein said one or more sequences of instructions cause further performance of:
in response to receiving, from said one or more data storage devices, an indication of uncorrected errors associated with corrupt data from at least one sector corresponding to at least one sub-data band ($D_{s\_i}$) of said data band, determining how much of said $1^{st}$-layer sub-data band parity matrix ($P_{E\_i}$) and/or said ($q^{th}$>1)-layer parity matrix ($P_{Eq\_k}$) is needed to recover said corrupt data;
requesting a read of less than the entire said data band but including said at least one sub-data band ($D_{s\_1}$) containing said corrupt data and at least some of said $1^{st}$-layer sub-data band parity matrix ($P_{E\_i}$) and/or said ($q^{th}$>1)-layer parity matrix ($P_{Eq\_k}$) based on said determining; and
recovering said corrupt data based on said at least one sub-data band ($D_{s\_1}$) containing said corrupt data and at least some of said $1^{st}$-layer sub-data band parity matrix ($P_{E\_i}$) and/or said ($q^{th}$>1)-layer parity matrix ($P_{Eq\_k}$).

18. The electronic data storage system controller manufacture of claim 15, wherein:
said electronic data storage system controller manufacture comprises an application-specific integrated circuit (ASIC); and
said writing includes writing without a corresponding write verify operation.

* * * * *